United States Patent [19]

Frahm et al.

[11] Patent Number: 4,748,409

[45] Date of Patent: May 31, 1988

[54] IMAGING MAGNETIC SPIN RESONANCE METHOD AND APPARATUS

[75] Inventors: Jens Frahm; Axel Haase; Wolfgang Haenicke; Klaus-Dietmar Merboldt; Dieter Matthaei, all of Goettingen, Fed. Rep. of Germany

[73] Assignee: Max-Planck-Gesellschaft zur Foerderung der Wissenschaften E.V., Goettingen, Fed. Rep. of Germany

[21] Appl. No.: 806,780

[22] Filed: Dec. 9, 1985

[30] Foreign Application Priority Data

Dec. 14, 1984 [DE] Fed. Rep. of Germany ....... 3445689

[51] Int. Cl.$^4$ ............................................. G01R 33/20
[52] U.S. Cl. ..................................... 324/309; 324/307
[58] Field of Search ............... 324/300, 307, 309, 311, 324/312, 313, 314, 318, 322; 128/653

[56] References Cited

U.S. PATENT DOCUMENTS

| | | | |
|---|---|---|---|
| 4,510,449 | 4/1985 | Ernst et al. | 324/309 |
| 4,553,096 | 11/1985 | Randell | 324/309 |
| 4,563,647 | 1/1986 | Young | 324/309 |
| 4,585,992 | 4/1986 | Maudsley et al. | 324/309 |
| 4,593,247 | 6/1986 | Glover | 324/309 |
| 4,595,879 | 6/1986 | Lent et al. | 324/309 |
| 4,607,223 | 8/1986 | Mallard et al. | 324/309 |
| 4,614,195 | 9/1986 | Bottomley | 324/309 |

OTHER PUBLICATIONS

Scientific American, May 1982.
Journal of Magnetic Resonance, 29, 355–373, (1978).
Physical Review, Nov. 15, 1950.
Journal of Chemical Physics, 52, Mar. 1st, 1970.

*Primary Examiner*—Michael J. Tokar
*Attorney, Agent, or Firm*—Frishauf, Holtz, Goodman & Woodward

[57] ABSTRACT

A method and an apparatus for a locally resolved investigation of a specimen, wherein the specimen is exposed to a constant magnetic field and a variable combination of three gradient magnetic fields directed substantially perpendicularly to each other and to a sequence of high-frequency (RF) pulses which contains three successive pulses with flip angles not equal to $|m\,Pi|$, and signals corresponding to a magnetic resonance of spin moments, in particular nuclear spin moments in said specimen are detected. The interval (tau) between the first and the second pulse is greater than $T_{2eff}$ and smaller than $5T_2$, and that the interval (T-tau) between the second and the third pulse is greater than $T_{2eff}$ and smaller than $5T_1$, wherein m is an integer,
$T_1$ is the spin-lattice relaxation time,
$T_2$ is the spin-spin relaxation time and
$T_{2eff}$ is the effective spin-spin relaxation time of the spins to be determined in the specimen.

At least one of said gradient fields is switched between the first and/or the second pulse and/or the second and the third pulse and/or after the third pulse, wherein at least one of the RF pulses is a frequency-selective pulse and at least one echo signal stimulated by the third pulse is detected and evaluated.

39 Claims, 36 Drawing Sheets

IMAGING MAGNETIC SPIN RESONANCE METHOD AND APPARATUS

The present invention relates to a method for a locally resolved investigation of a specimen in which a specimen is exposed to a constant magnetic field and a variable combination of three gradient magnetic fields directed substantially perpendicularly to each other and subjected to a sequence of high-frequency or radio-frequency pulses which contains three successive pulses with flip angles not equal to $|m\,Pi|$, and signals corresponding to a magnetic resonance of spin moments, in particular nuclear spin moments, are measured. The invention thus relates primarily to a method for imaging nuclear magnetic resonance (NMR) tomography, although it is not restricted thereto but can also be applied to electron spin resonance methods.

The principle of NMR tomography and other imaging NMR methods is described for example in a publication by I. L. Pykett in the journal "SCIENTIFIC AMERICAN", May 1982, p. 54 to 64, and "Spektrum der Wissenschaft", July 1982, p. 40 to 55, to which express reference is made here. In the present method as well, as in this publication, the image reconstruction can be effected in accordance with the principle of Fourier zeugmatography as explained with the aid of FIG. 8 of this publication. Corresponding explanations will be found in the publication by P. Mansfield and I. L. Pykett in "Journal of Magnetic Resonance" 29, 355–373 (1978).

NMR methods in which stimulated echo pulses are generated are described in the publication by E. L. Hahn, "Physical Review" 80, 4, Nov. 15, 1950, p. 580 et seq. and by J. E. Tanner in the "Journal of Chemical Physics" 52, No. 5, March 1970, p. 2523–2526. In these known methods, which are however non-imagining integral methods for measuring certain specimen parameters, such as relaxation times or diffusion coefficients, three non-selective ("hard") RF pulses are caused to act on the sample, i.e. RF oscillation trains of shortest possible duration and greatest possible amplitude.

Finally, from J. Chem. Phys. 64, 2229 (1976) highly resolving two-dimensional NMR methods are known (homonuclear Overhause effect and chemical exchange) which although they also employ three RF pulses do not detect any stimulated echo and also cannot be used for image production (no gradient switching).

The present invention is based on the problem of further developing a method of the aforementioned type so that more rapid and/or hitherto impossible space-selective and/or line-selective imaging measurements can be carried out.

This problem is solved according to the invention in a method of the type mentioned at the beginning in that the interval tau between the first and the second pulse is greater than $T_{2eff}$ and smaller than $5T_2$, for example smaller than $2T_2$, and that the interval T-tau between the second and the third pulse is greater than $T_{2eff}$ and smaller than $5T_1$, for example smaller than $3T_1$, wherein m is an integer, $T_1$ is the spin-lattice relaxation time, $T_2$ is the spin-spin relaxation time and $T_{2eff}$ is the effective spin-spin relaxation time of the spins to be determined in the specimen, that at least one of the gradient fields is switched over between the first and/or the second pulse and/or the second and the third pulse and/or after the third pulse that at least one of the pulses is a frequency-selective pulse and that at least one echo signal stimulated by the third pulse is detected and evaluated.

In the method according to the invention each individual experiment ("shot"), i.e. each sequence of at least three pulses of the type indicated, of which at least the first two are preferably so-called 90 degree pulses (Pi/2 pulses), supplies a plurality of signals so that several different information items are available for the evaluation. For example, signals can be generated from several planes, and/or signals for a nuclide with different chemical bonding (e.g. the proton spin resonance of water and fat) and/or differently coded signals in more rapid succession than hitherto so that a real time NMR imaging of moving structures, in particular moving organs of the human or animal body, can be presented.

Avoiding 180 degree pulses for generating stimulated echo signals is an essential factor in the present method. The signal amplitude if the greater the more the energy of the RF pulses approaches that corresponding to a flip angle of exactly 90 degrees. It is however expedient in many cases to make at least the third pulse smaller so that is corresponds to only a faction of the flip angle of 90 degrees ("fraction pulse").

By such "fraction pulses" the information which was stored by the second pulse in the form of phase-coded longitudinal magnetization can be fetched in portions and selectively utilized. A further advantage of certain embodiments of the present method resides in that between the instant at which a gradient field is switched and the occurrence of a useful signal a period of time may elapse which is so large that the eddy currents induced by the switching of the gradient fields in a static magnetic system have substantially dies down. It may furthermore be expedient to supplement the stimulated echo sequence by additional 180 degree pulses after the first pulse, the second pulse or the third pulse.

In the method according to the invention the second pulse acts generally as refocusing pulse and generates a spin echo (SE) whose distance from the second pulse is equal to the interval between the first and second pulse. The third pulse is a read pulse which turns the spins stored by the second pulse completely or partially through 90 degrees and accordingly generates a stimulated echo. A sequence of read pulses may also be used and the sum of the fractions of the read pulses can correspond to a flip angle substantially greater than 90 degrees.

Further advantages are: variability of the pulses, intervals and gradient switchings; interchangeability of the pulses; no use of frequency-selective 180 degree pulses, no second compensation experiment necessary, improved band width of the RF excitation; substantial reduction of the measurement duration and/or the necessary RF power; "compartmenting: of the longitudinal magnetization into phasecoded and non-phase-coded (relaxed) components; distinguishability of the signals between free induction decay (FID), gradient echo (GE), spin echo (SE) and stimulated echo (STE); possibility of independent utilization of the times of information contained in the echoes (e.g. multiple codings for normal and zoom images or flow measurements); "portionability: of the phase-coded longitudinal magnetization and generation of corresponding stimulated echoes; possibility of combination of various specific embodiments; possibility of combination with methods for generating spin-echo signals.

Hereinafter examples of embodiment of the invention will be explained with reference to the drawings.

All the Figures show time diagrams (from the top to the bottom)
of the radio-frequency pulses RF made to act on the specimen,
the essential induced output signals and
the amplitude of the three gradient magnetic fields, in particular of the slice gradient (G slice), the phase gradient (G phase) and the read gradient (G read).

Of the RF pulses in the drawings only one possible envelope is illustrated; rectangular RF pulses represent non-selective RF pulses. In the presentation of the gradients only one of the possible applications is shown. The exact switches may differ from the schematic drawings according to the desired durations and/or amplitudes and/or the properties of the gradient coils and/or power supplies. The gradient switches have to fulfill the known conditions for refocussing the slice selection gradient and/or read gradient.

In the representation of the phase gradient by horizontal dashes the change of the phase gradient for measuring cycle to measuring cycle or experiment to experiment (shot to shot) is indicated.

The present method can be carried out with the known spin resonance apparatuses, in particular NMR apparatuses, and only the control device defining and switching the gradient magnetic fields and the exciting RF pulse is modified or set so that it can carry out functions corresponding to one or optionally one or more embodiments of the present novel method. Advantageous and preferred examples of embodiments of the invention will be explained hereinafter.

Figure 72:
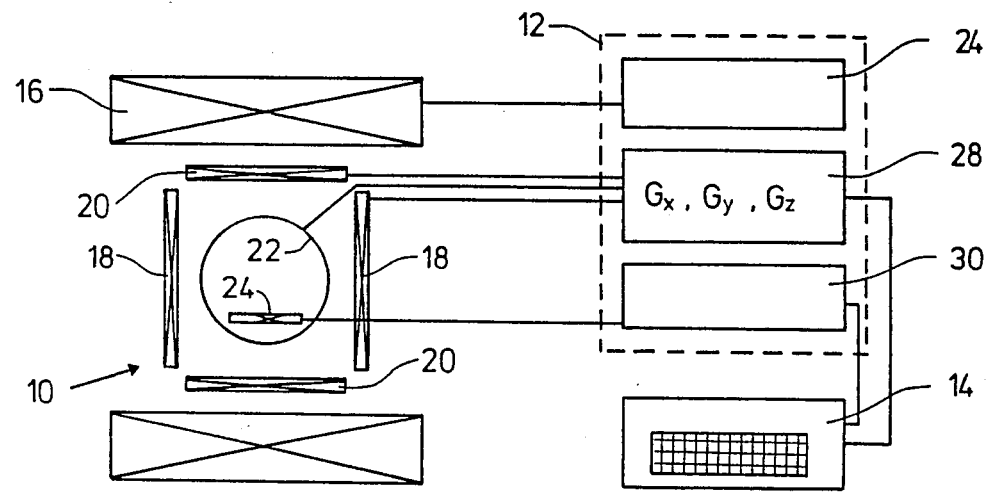
FIG. 72 shows schematically an NMR apparatus with which the method according to FIGS. 1 to 71 can be carried out.

As shown schematically in FIG. 72 a conventional NMR apparatus comprises a measuring head 10, a power supply section 12 and a control section 14. The measuring head 10 of the apparatus may, as is usual, contain a magnet 16 for generating a constant homogeneous $B_0$ field, furthermore coil sets 18, 20, 22 for generating three "gradient" magnetic fields directed substantially perpendicularly to each other and having a generally linear gradient, and a coil arrangement 24 to which RF pulses are supplied. The magnetic coil 16 can be coupled to an excitation unit 26. The gradient coils 18, 20 and 22 are coupled to a power supply circuit 28 which is controllable by the control section 14 and makes it possible to control individually the currents in the gradient coils. The RF coil arrangement 24 is fed by an RF generator 30 which is also controlled by the control section so that the coil arrangement 24 can be supplied with RF pulses having a desired duration, amplitude, envelope curve, and in a desired time sequence. Generally, the RF coil is also used for signal detection. The term "RF pulse" is intended to include both an oscillation train of predetermined frequency with rectangular or envelope curve of any type which, if it is short and has a high amplitude, is referred to as non-selective ("hard") pulse, and also a frequency-modulated RF oscillation train, as well as a sequence of mutually spaced relatively short RF oscillation trains which can have the same or different oscillation frequencies, giving as a whole a predetermined flip angle. In the case of the first two pulses, irrespective of which of the aforementioned configurations they have, this angle is preferably 90 degrees because this provides the largest signals. A "frequency-selective" pulse is a pulse such as a slice pulse, a stripe pulse, a selection or zoom pulse or a resonance-line-selective pulse (line pulse) which possibly in cooperation with gradient fields permits space selection or frequency selection.

$T_1$ is the spin lattice relaxation time which with biological specimens can have the order of magnitude of a second and is primarily employed in the present method.

$T_2$ is the natural spin-spin relaxation time.

$T_{2eff}$ is the effective spin-spin relaxation time.

In the present method a pulse sequence is processed which contains three pulses each corresponding to a flip angle not equal to 180 degrees. The ideal flip angle, at least for the first two pulses, is 90 degrees and generally speaking the useful output signal is the greater the nearer the flip angle is to 90 degrees.

The interval tau between the first and the second pulses is to be greater than $T_{2eff}$ and smaller than $5T_2$, for example less than $2T_2$. The interval T-tau between the second and the third pulses is to be greater than $T_{2eff}$ and less than $5T_1$, for example less than $3T_1$. With increasing interval between the second and third pulses the amplitude of the output signals following the third and any further pulses also decreases, these signals being stimulated spin-echo signals (STE).

Figure 1:
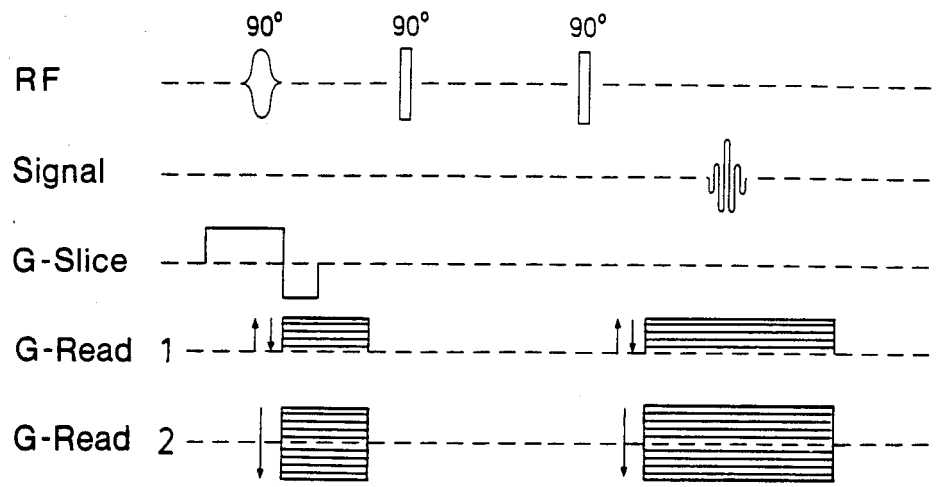
FIGS. 1 to 19 are corresponding diagrams for embodiments of the present method furnishing slice tomograms with one slice pulse.

FIG. 1 shows the time variation of the various pulses, signals and gradient fields for an embodiment of the present invention in which a projection reconstruction imaging takes place using the stimulated spin echo STE as useful signal. The first pulse is a selective 90 degree slice pulse, the second and third pulse in each case a non-selective pulse. The read gradients (G read 1, G read 2) are altered synchronously and stepwise from individual exposure to individual exposure in the direction of the arrow. They assume values which are indicated by the horizontal lines.

In this embodiment of the method the fragment enlargements can be produced without folding problems. The resultant read gradient is equal to zero during the RF pulse.

Figure 2:
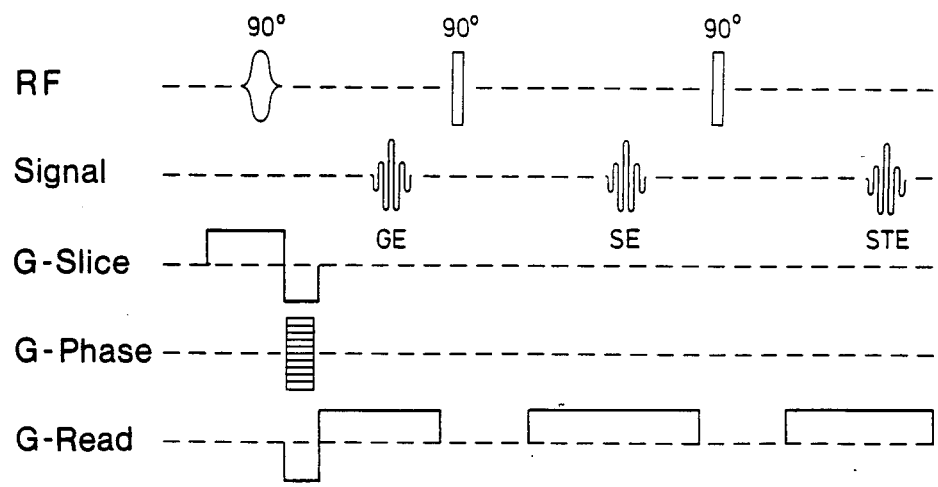
Figure 3:
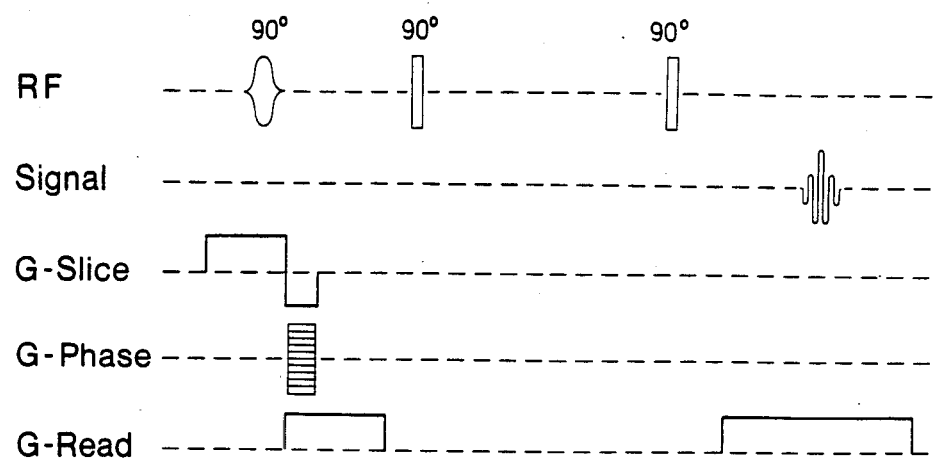
Figure 4:
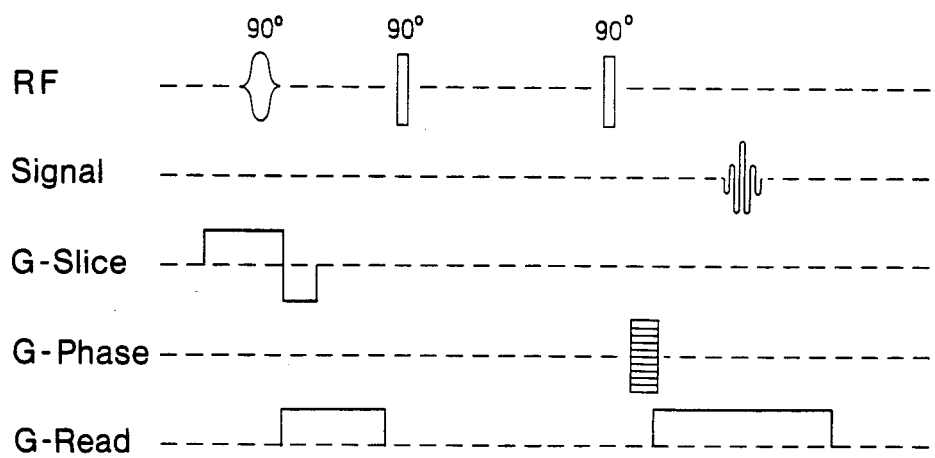
Figure 5:
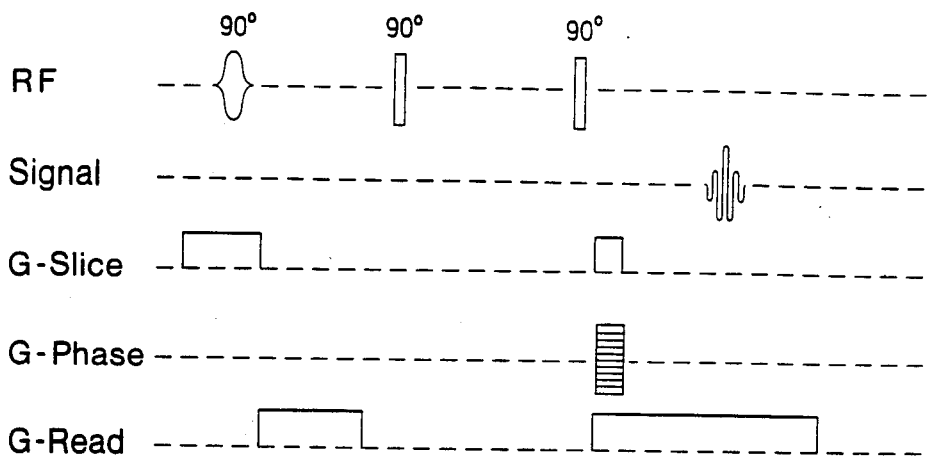
Figure 6:
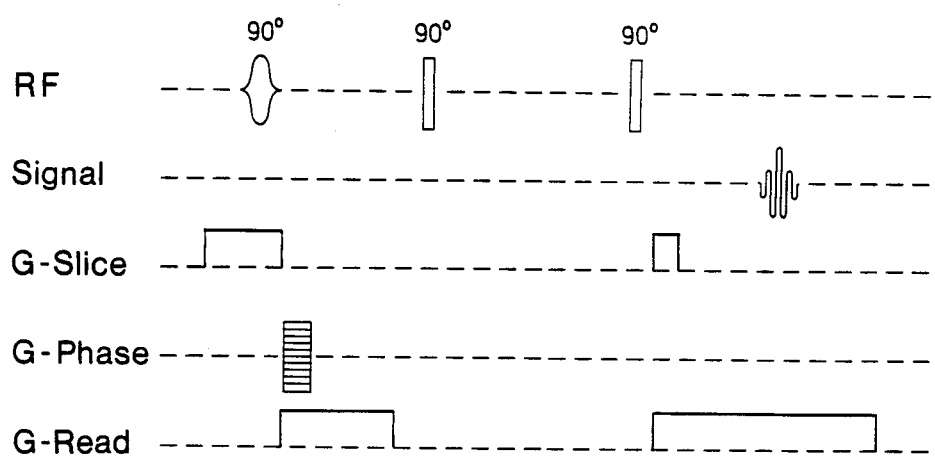
Figure 7:
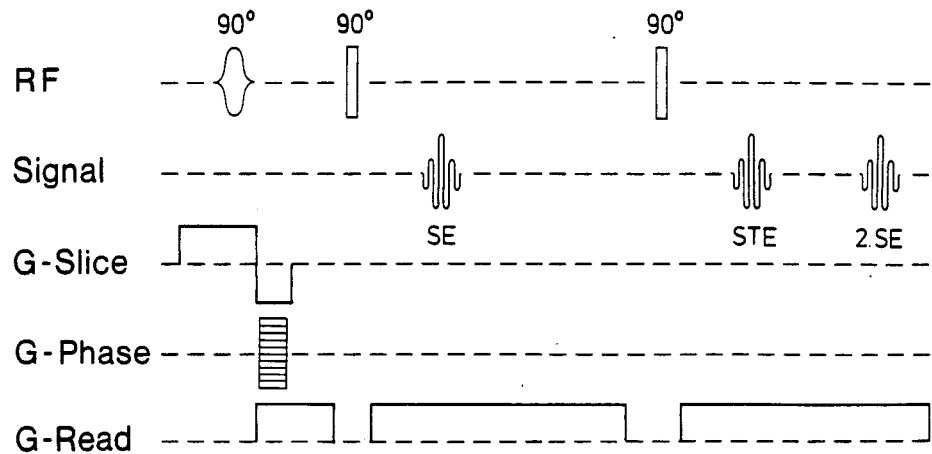

The following embodiments according to FIGS. 2 to 67 will be explained on the basis of the Fourier imaging.

In the embodiments according to FIGS. 2 to 19 a data collection is possible by detecting the gradient echo GE, the spin echo SE and the stimulated spin echo STE; of course, not all the echo signals need be used.

The methods according to FIGS. 2 to 7 are different variants in which the slice pulse is the first pulse and the slice and the phase gradient are variable.

Figure 8:
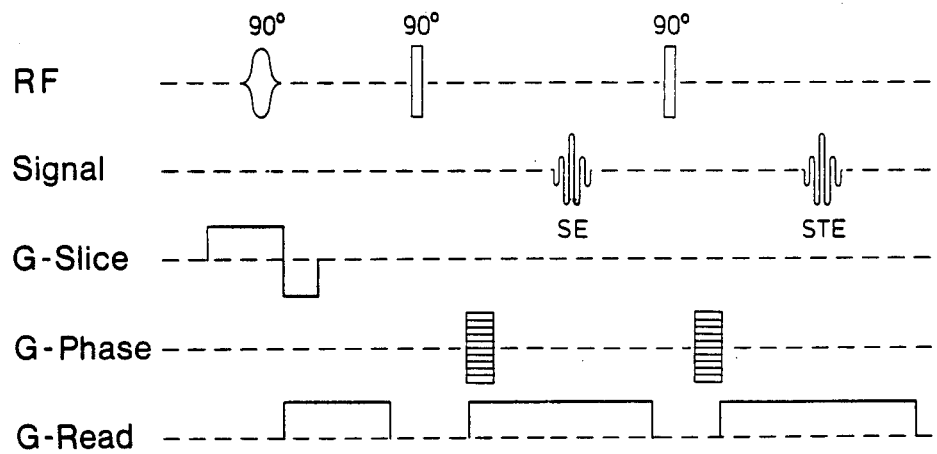
Figure 9:
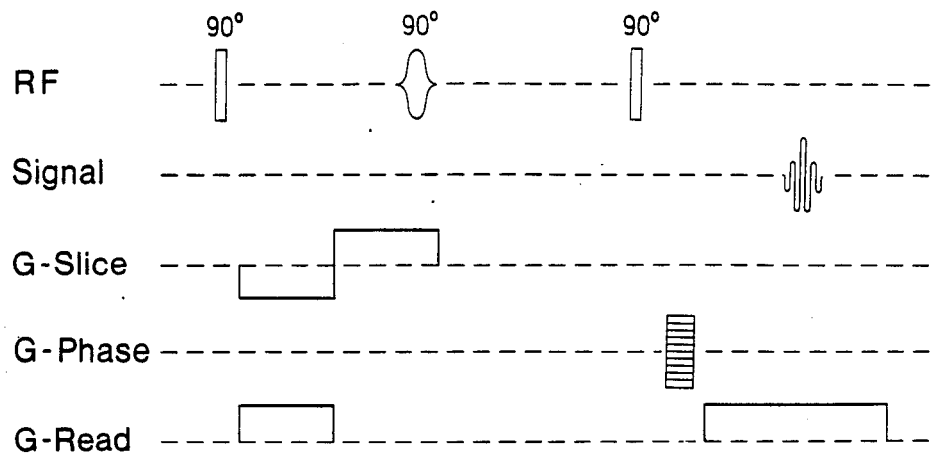
Figure 10:
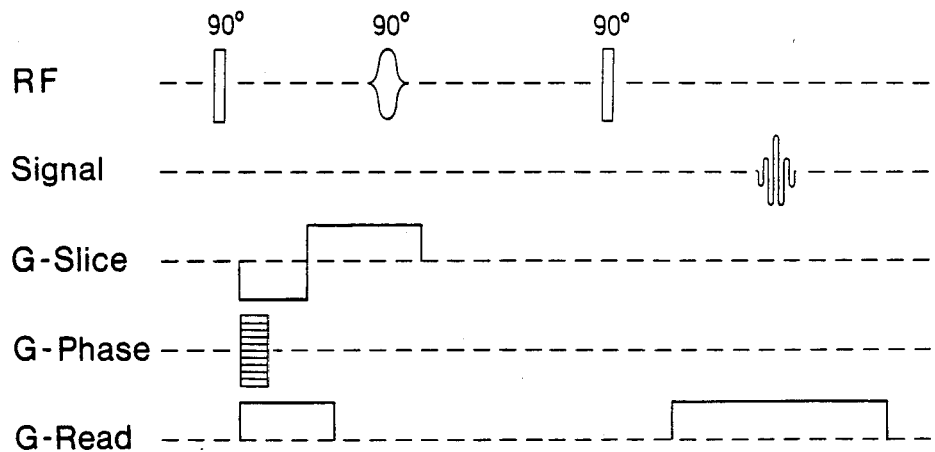
Figure 11:
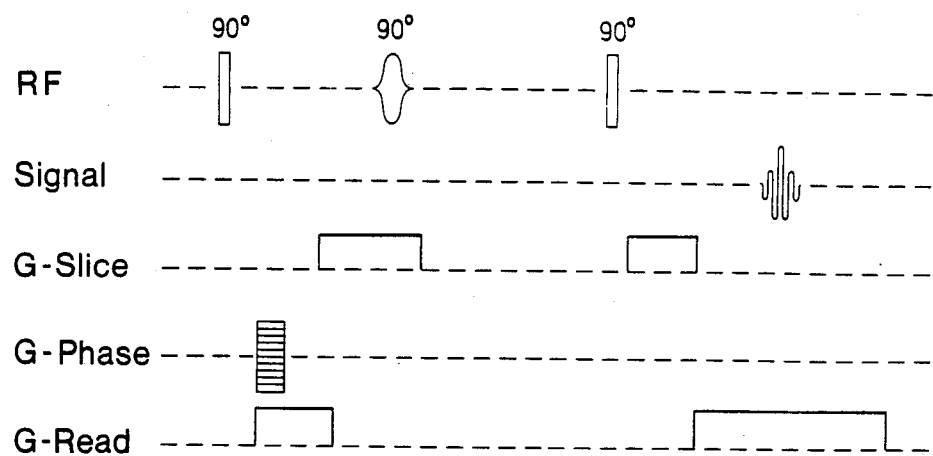
Figure 12:
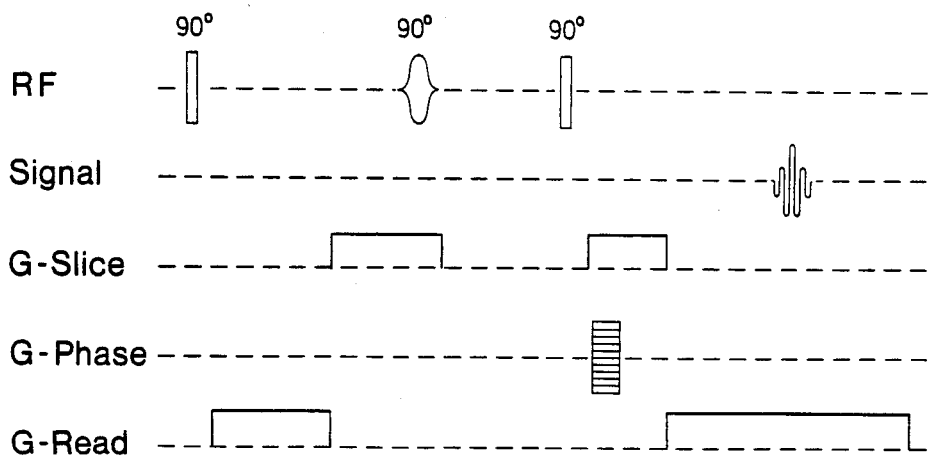

In the embodiment according to FIG. 8 the image generated with the aid of the second and third RF pulses are independent of each other.

Figure 13:
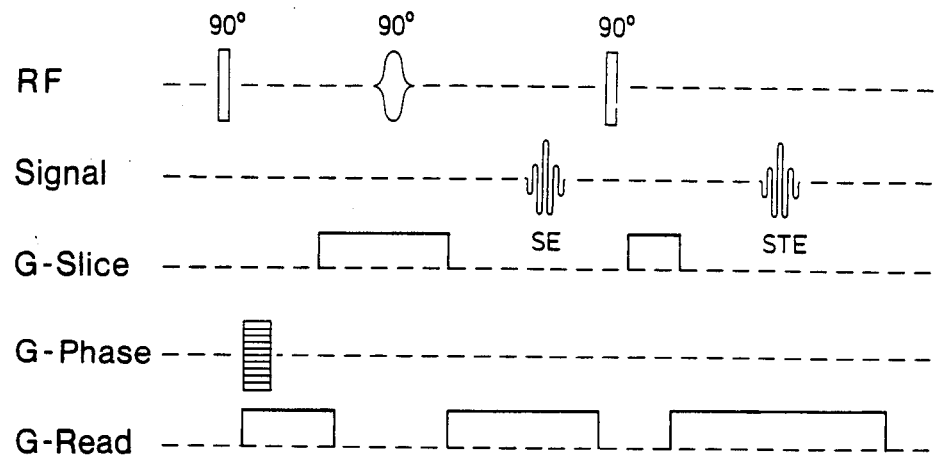
Figure 14:
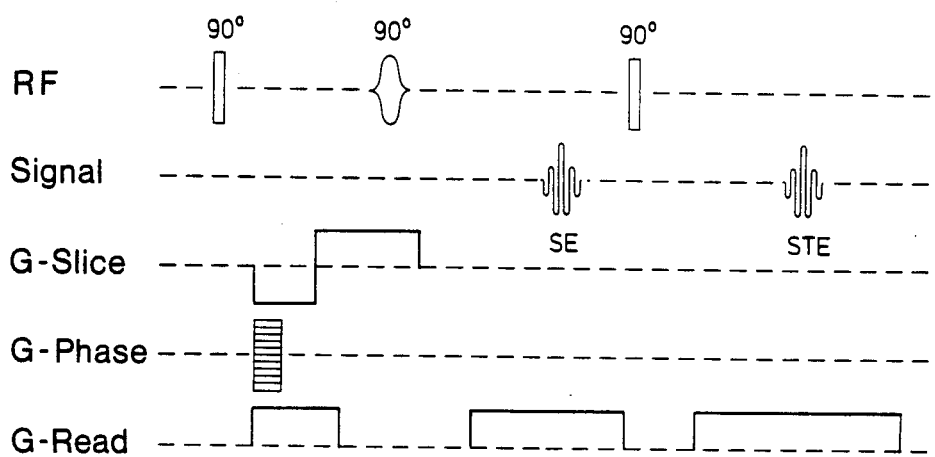
Figure 15:
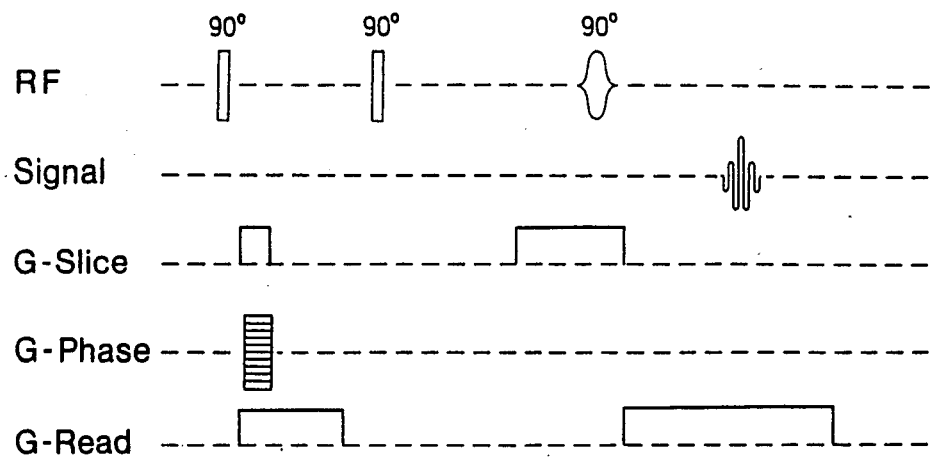
Figure 16:
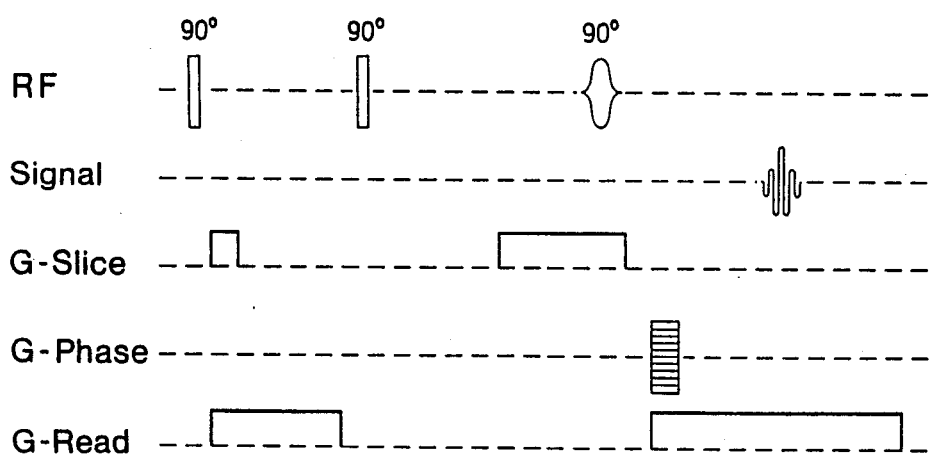
Figure 17:
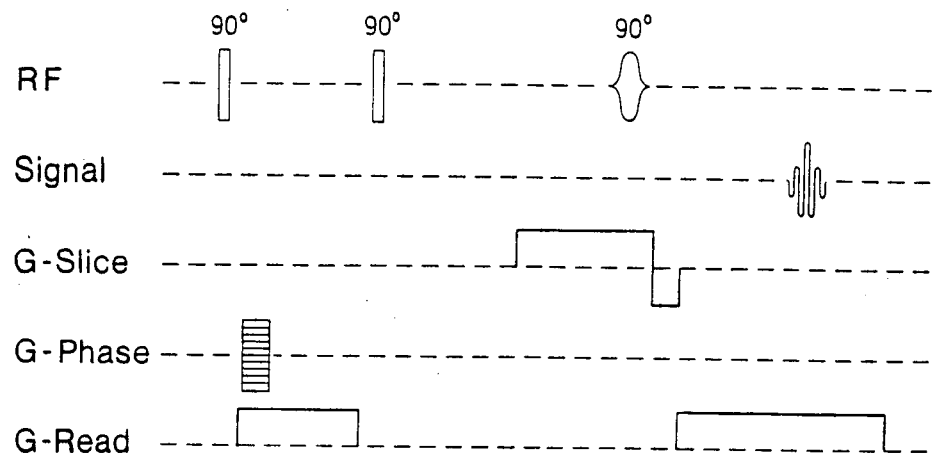
Figure 18:
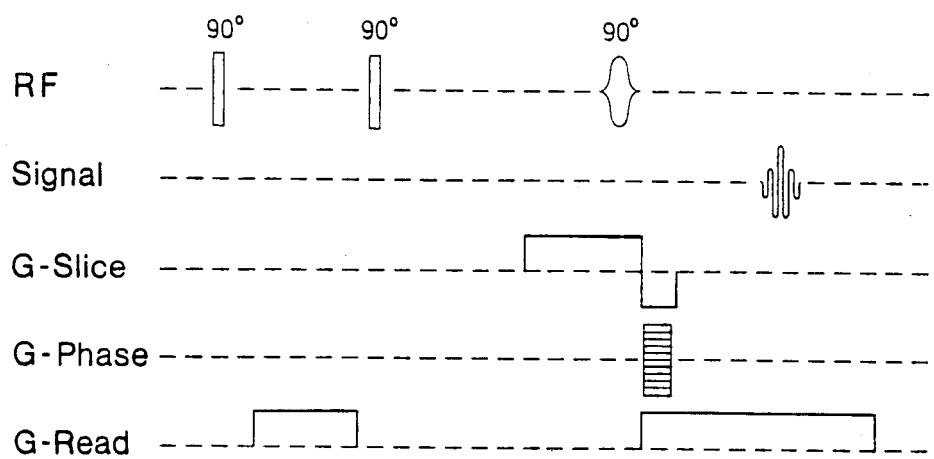
Figure 19:
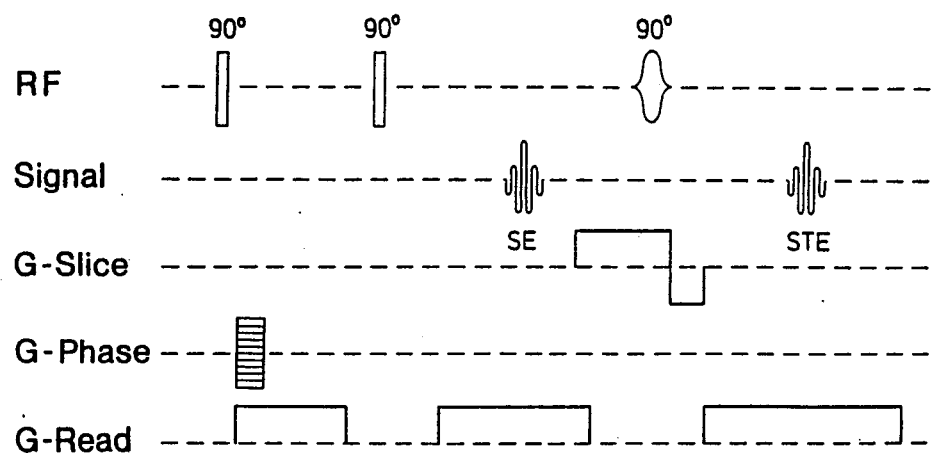
Figure 20:
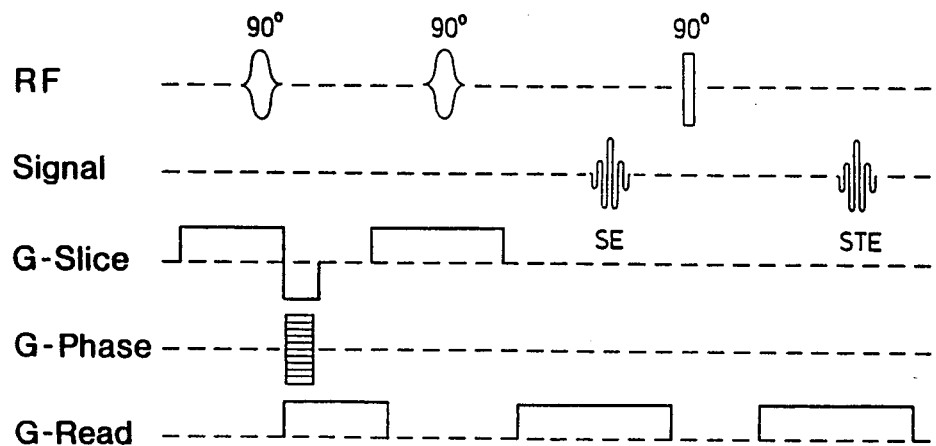
FIGS. 20 to 32 are corresponding diagrams for embodiments of the invention for generating slice tomograms with two or three slice pulses.
Figure 21:
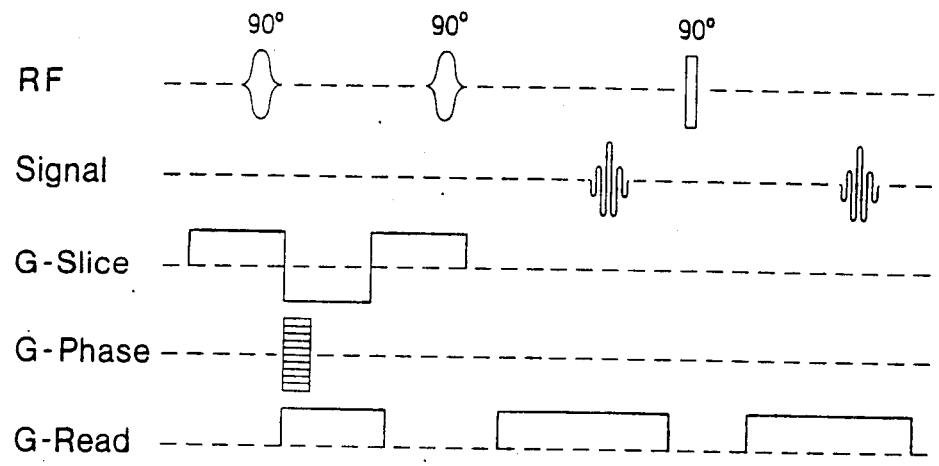
Figure 22:
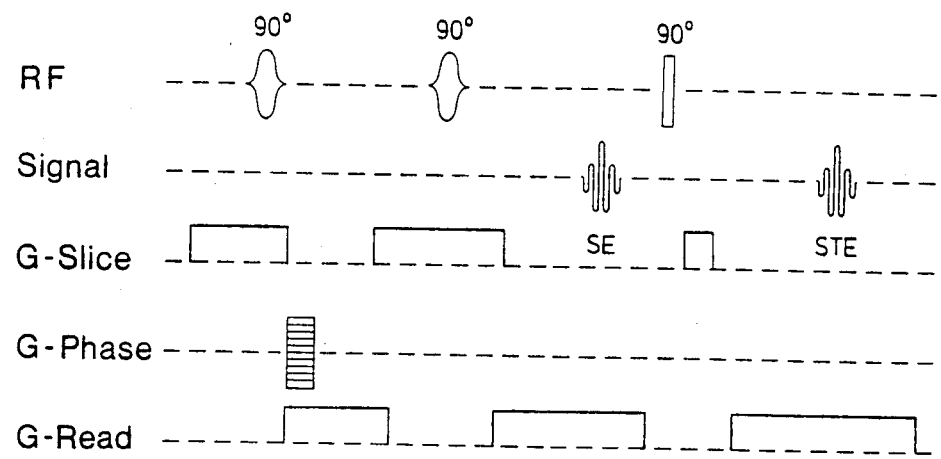
Figure 23:
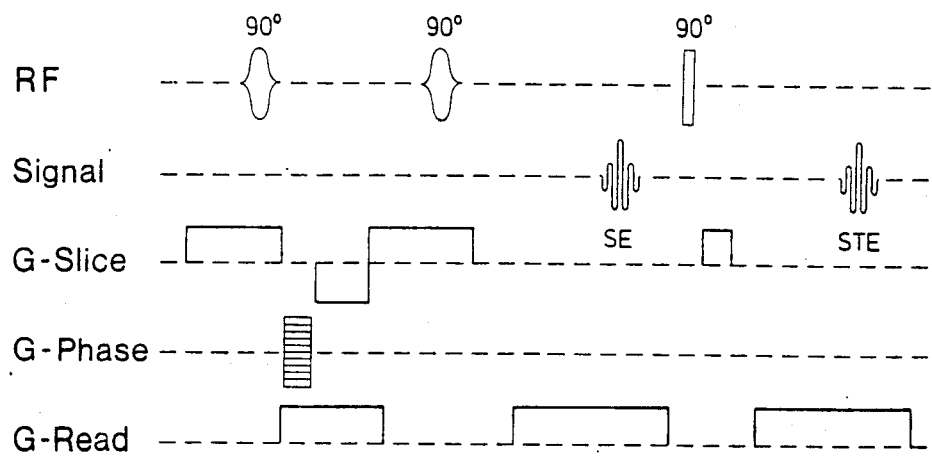
Figure 24:
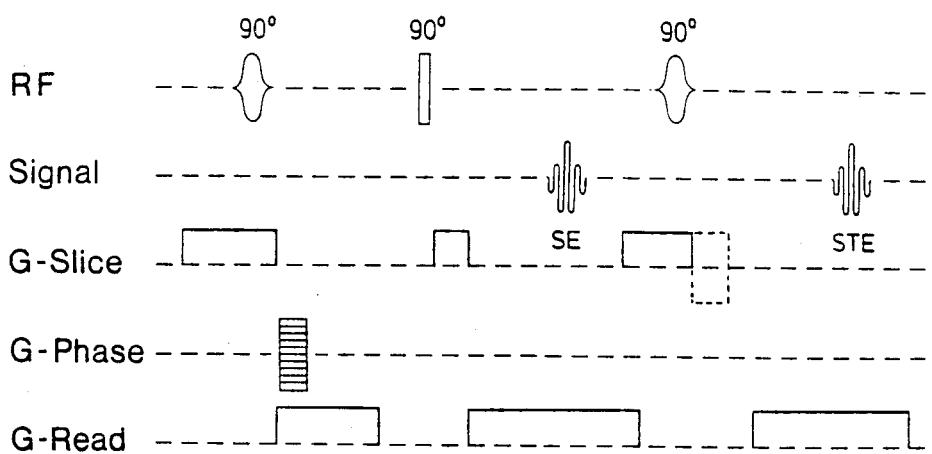
Figure 25:
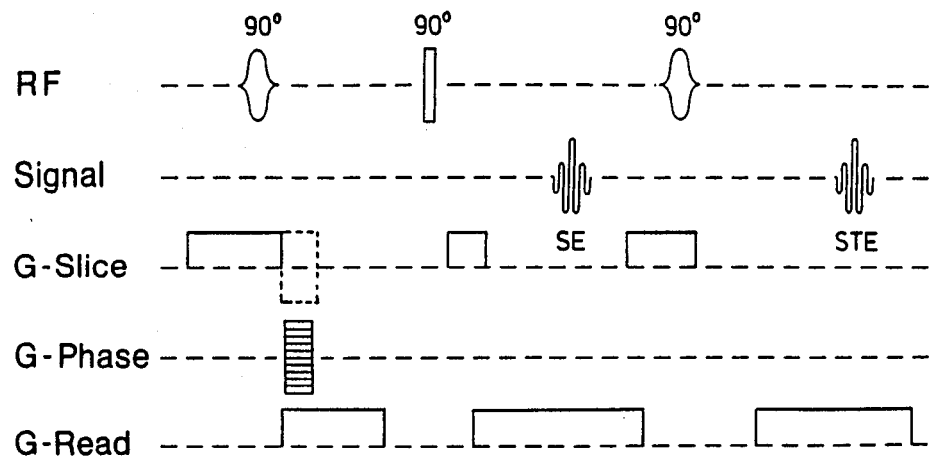
Figure 26:
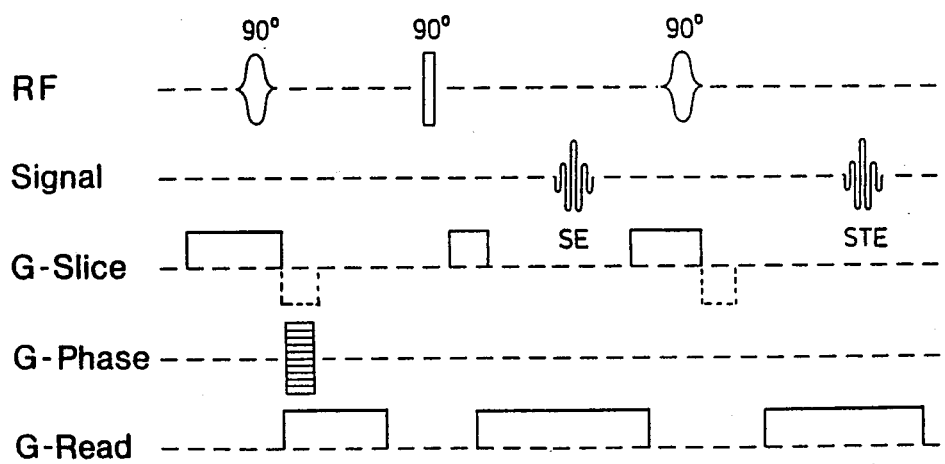
Figure 27:
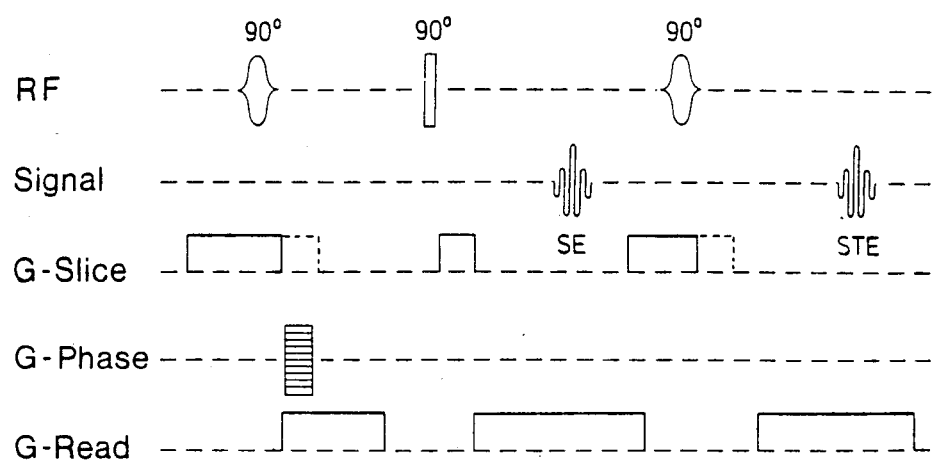

FIGS. 9 to 14 show corresponding embodiments in which the slice pulse is the middle pulse. FIGS. 13 and 14 involve multiple echo imaging.

FIGS. 15 to 19 relate to embodiments in which the slice pulse is the third pulse. In this case the SE signal indicated only in FIG. 19 supplies a transillumination image because the first two pulses are not selective and consequently no slice selection takes place before generation of the SE signal.

FIGS. 20 to 32 relate to embodiments for generating slice tomograms by means of two or three slice pulses. Two slice pulses relate to the same slice.

FIGS. 20 to 23 show variants with slice pulses as first (leading) and second (middle) pulse. FIGS. 24 to 27 show variants in which the first and the third pulse is a slice pulse.

The dash-line parts of the slice gradient field (G slice) cancel each other out in their effects and can thus be omitted as shown in full line.

Figure 28:
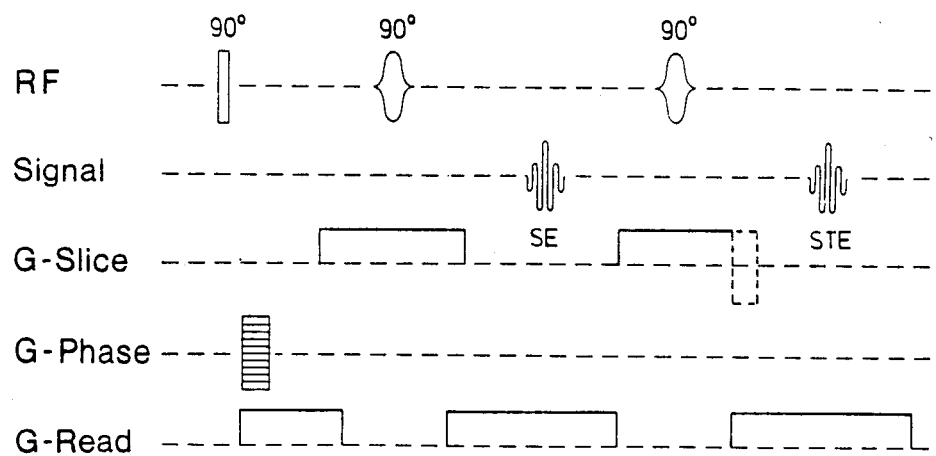
Figure 29:
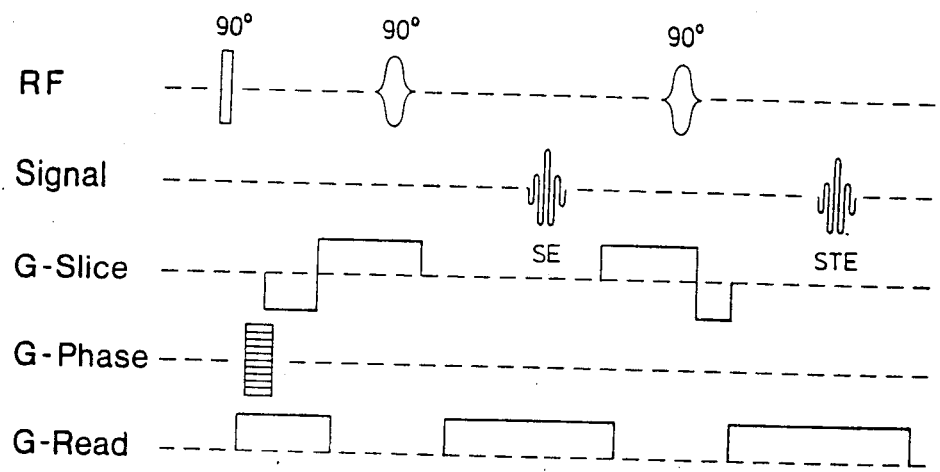

FIGS. 28 and 29 show variants in which the second and third pulse is in each case a slice pulse. In FIG. 28 the parts of the slice gradient field which cancel each other out are again shown in dashed line.

Figure 30:
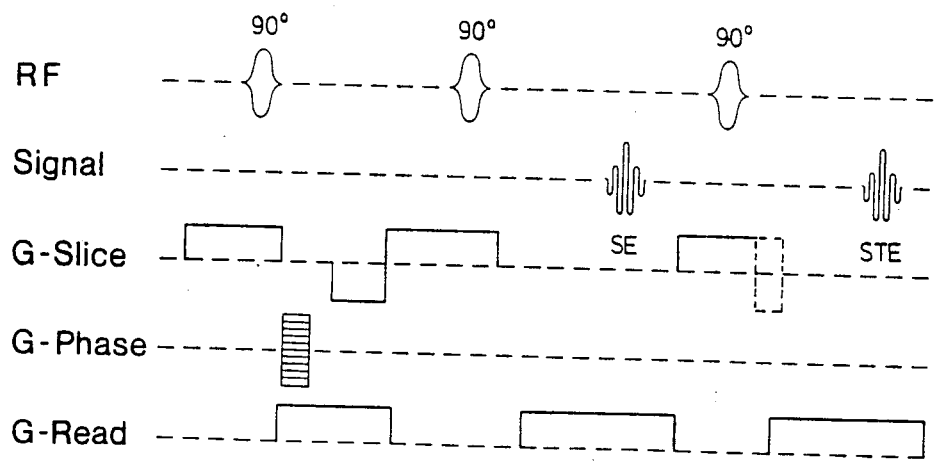
Figure 31:
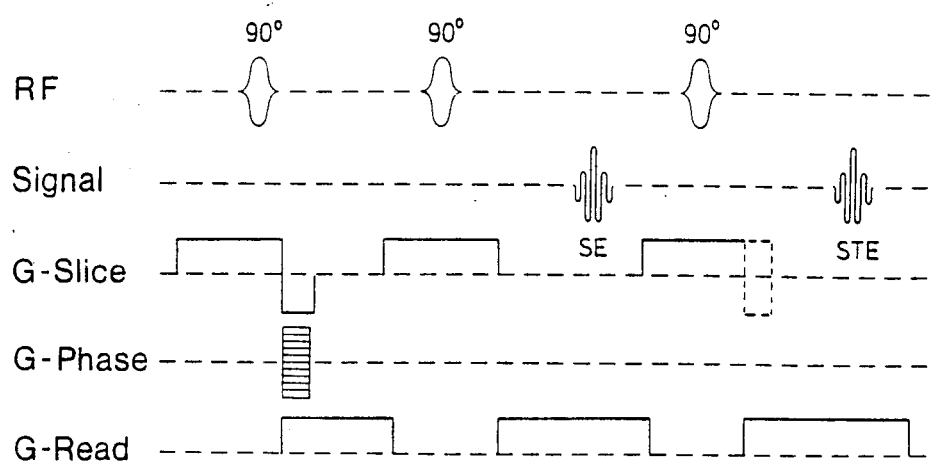
Figure 32:
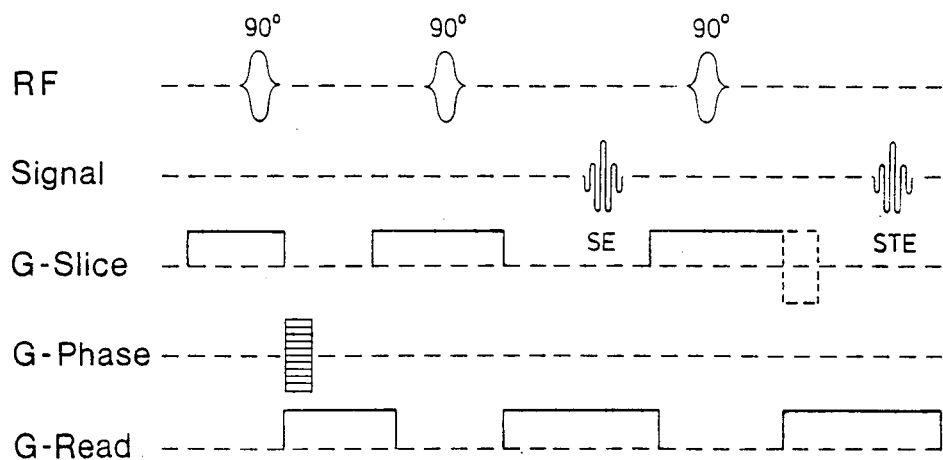

FIGS. 30 to 32 show embodiments with three slice pulses.

FIGS. 33 to 37 show how the present method can be used for a localized spectroscopy and tomography with two or three space-selective pulses (slice pulses) in different gradient directions. In particular, zoom or fragment tomograms can be carried out, a simultaneous taking of general and zoom tomograms and a point spectroscopy. The nonselective pulses illustrated may be replaced by frequencyselective pulses.

Figure 33:
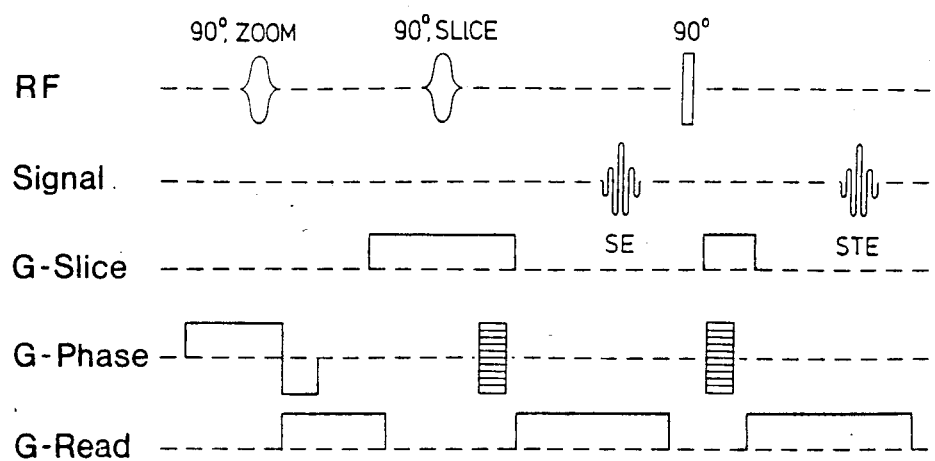
FIGS. 33 to 37 are corresponding diagrams of embodiments of methods for tomography and localized NMR spectroscopy with two or three space-selective pulses (slice pulses) in different gradient directions.
Figure 34:
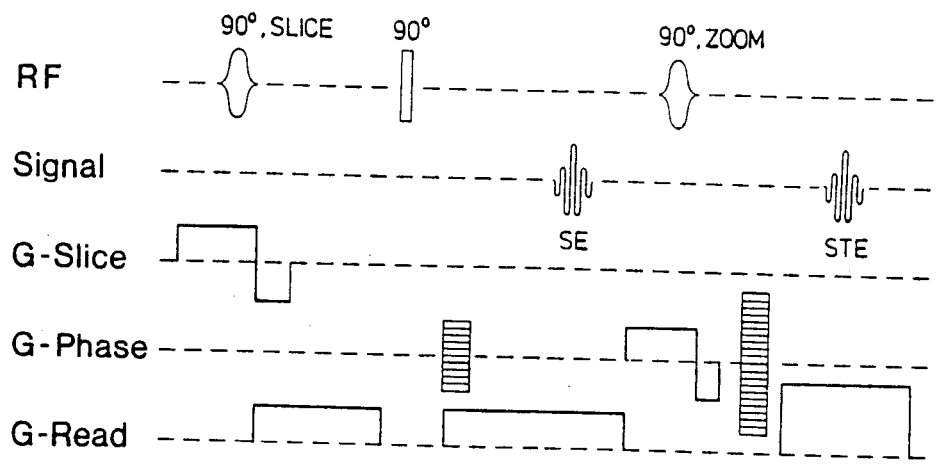

The embodiment according to FIGS. 33 and 34 relate to methods for zoom tomography in combination with general tomograms. In zoom tomography a stripe in a selected slice can be shown enlarged.

The method according to FIG. 34 supplies normal spin-echo images and fragment (zoom) STE images.

Figure 35:
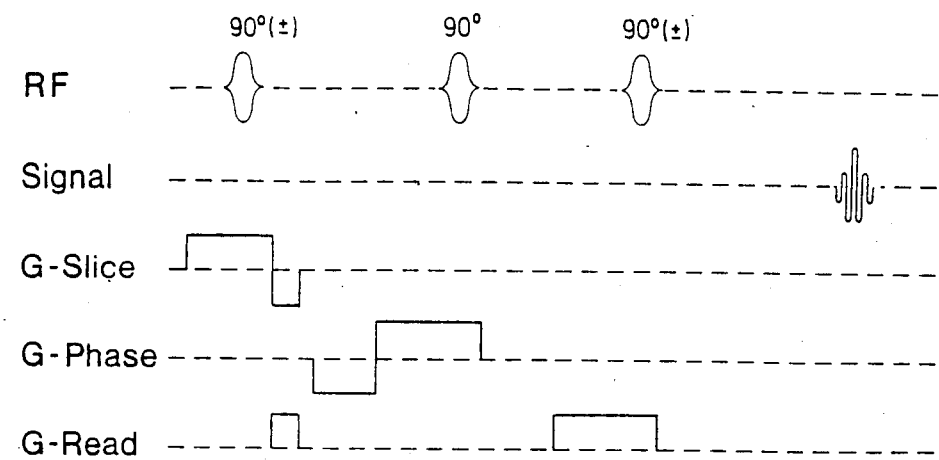

The method according to FIG. 35 is used for point spectroscopy and operates with three slice pulses. The phase relationship between the first and third slice pulses may be used on addition or subtraction of several individual experiments with suitable phase positions (here a simple example is indicated) for suppressing undesirable signals. From the STE signal, which s read without gradient, in known manner by Fourier transformation the resonance line spectrum can be obtained.

Figure 36:
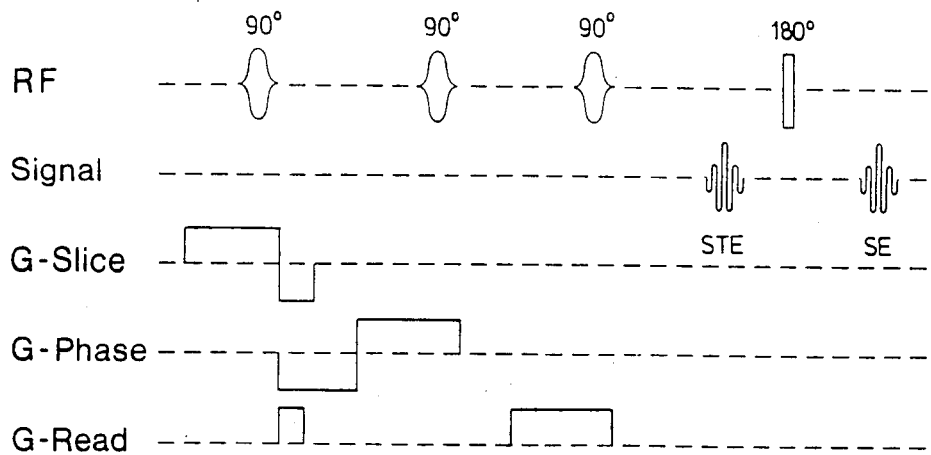

FIG. 36 relates to a method for localized STE spectroscopy in which the signal component originating from a specific resonance line, for example that of water, can be suppressed by $T_1$ and $T_2$ discrimination. The line which is erased depends on Tau and T-Tau as well as on the interval between the 1st STE and the 180 degree pulse.

Figure 37:
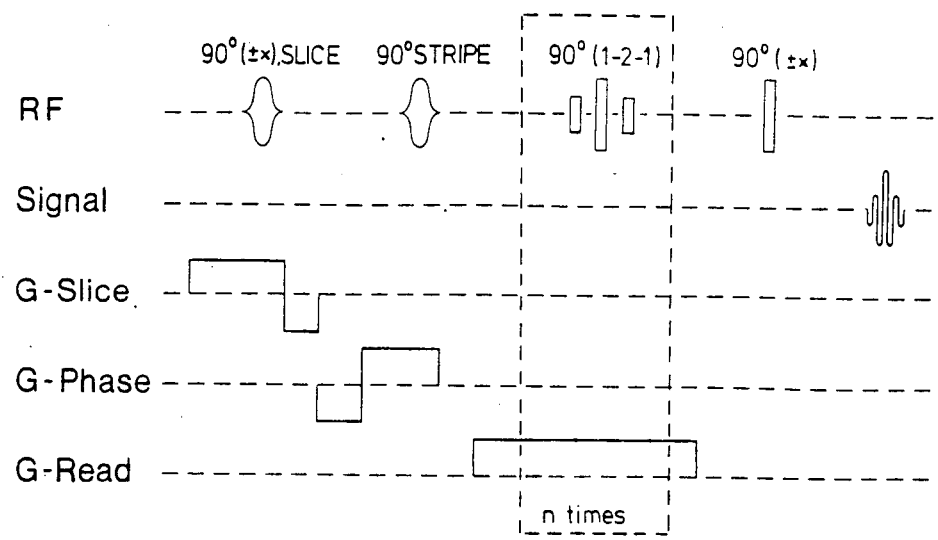

In FIG. 37 between the second and the third pulses a pulse sequence is employed with a gradient which from the stripe stored in the longitudinal magnetization excites and dephases magnetization components in such a manner that a point remains whose spectrum can be read out with the third pulse in the form of a stimulated echo.

Thus, a point spectroscopy is carried out with two slice pulses or with one slice pulse and one stripe pulse and a focusing by non-selective ("hard") pulse packages (e.g. as represented with the amplitude ratios 1-2-1) in the third dimension.

A simultaneous taking of fragment or zoom and general images was not possible with the hitherto known methods. The signal losses in point spectroscopy are minimized between the second and third pulses due to the $M_z$ scoring. The version according to FIG. 37 makes it possible to wait for the decay of the eddy current effects in the $B_O$ coil arising on switching of the gradients and thus eliminate their influence on the NMR spectra.

Figure 38:
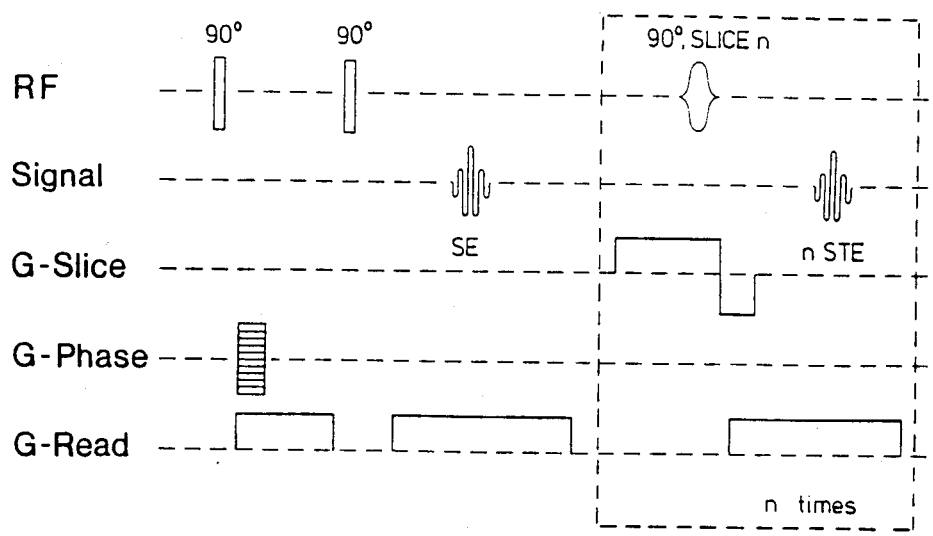
FIGS. 38 and 39 are embodiments of the present method furnishing multislice tomograms which permit more efficient utilization of the investigation time by measurement of a large number of slices directly adjacent and/or at any desired distance apart with short repetition times for the individual experiments.
Figure 39:
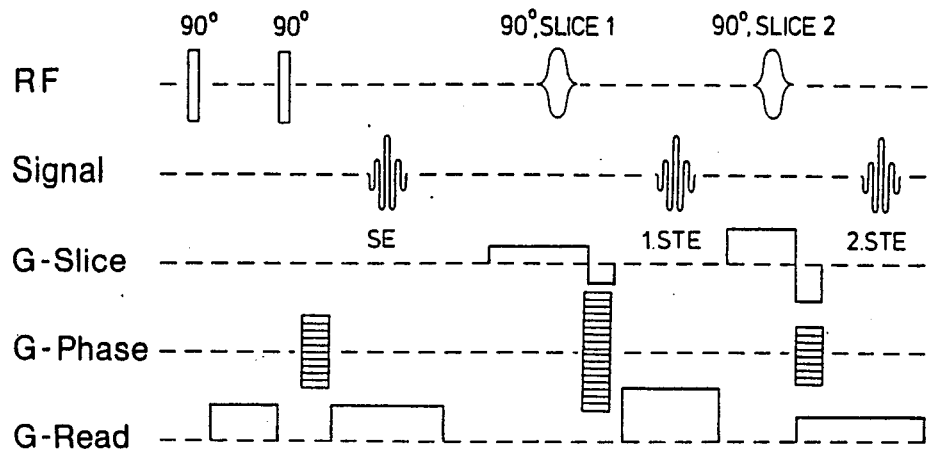

FIGS. 38 and 39 relate to methods for making multilayer tomograms with simultaneous taking of a transillumination picture. Nonselective pulses can be replaced by frequency-selective pulses.

FIG. 38 is a typical version for producing multi-layer or multi-slice tomograms. The method according to FIG. 39 makes it possible to produce multi-slice tomograms independent of each other. The first two pulses are in each case non-selective pulses and accordingly excite the entire spectrum. Alternatively, here as well frequency-selective pulses may be used which excite specific NMR frequencies but are space-independent. The transillumination image is obtained from the spin echo SE. The $T_1$ contrast of the multi-slice tomograms is infinitely variable by the length of the second interval and independent of the repetition time.

With the method according to FIG. 39 individual images can be produced which are independent of each other as regards their coordinates x, y, z.

In contrast to the spin-echo sequences hitherto used with this method it is possible to image slices lying directly adjacent each other. A further advantage is the possibility of being able to read out the individual slices rapidly (for example within only 20 to 30 ms) so that in short repetition times of for example 0.5 seconds it is still possible to measure about 20 slices. A further considerable advantage which is particularly significant at higher frequencies is the low RF power which has to be applied per slice (only one 90 degree pulse per slice). These multislice methods represent in many cases an adequate substitute for the considerably more time-consuming 3D tomography methods. The intensity of the multi-slice pictures decreases with $\exp(-(T-tau)/t_1)$, (T-tau) denoting the interval between the second pulse and the slice pulse.

Figure 40:
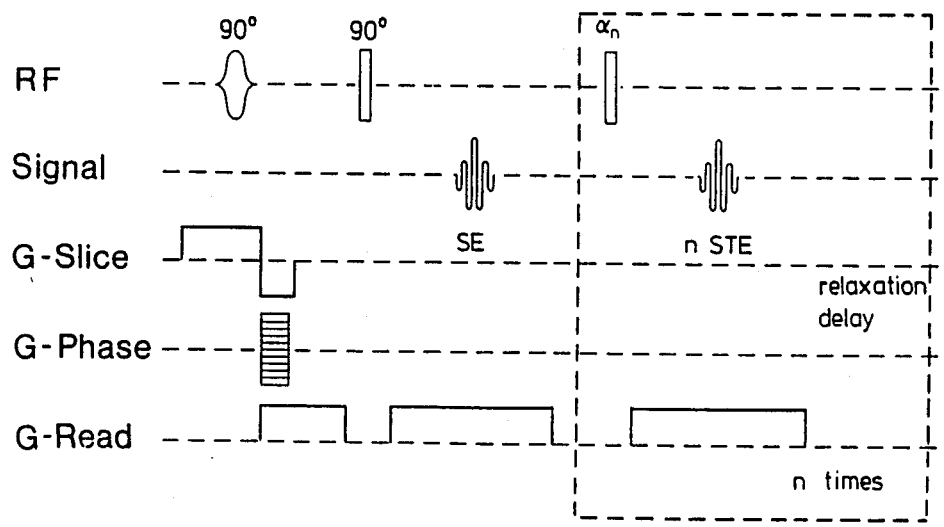
FIGS. 40 to 42 are embodiments which permit production of a series of spatially highly resolved NMR tomograms along the $T_1$ relaxation curve in the measuring time of a single tomogram.
Figure 41:
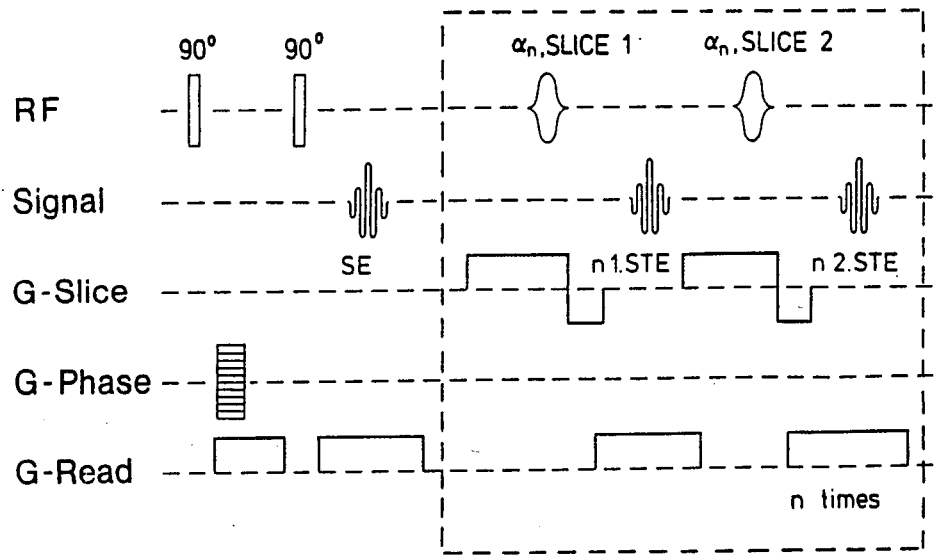
Figure 42:
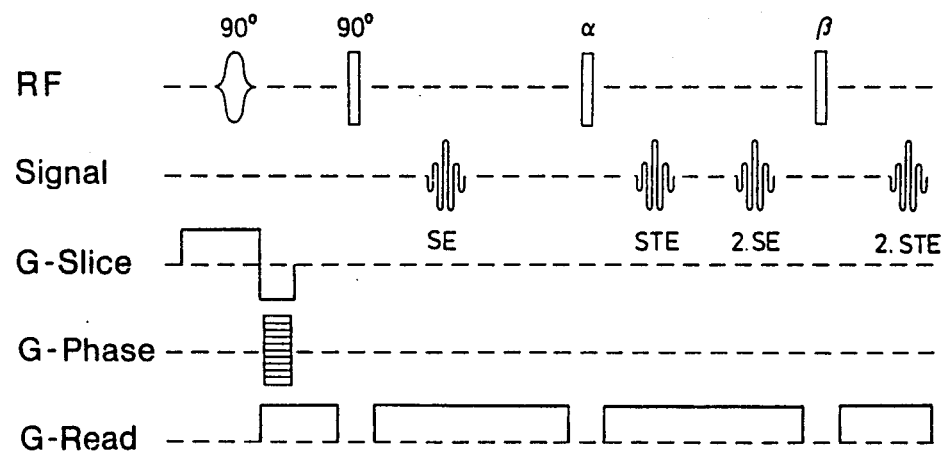

FIGS. 40 to 42 relate to advantageous embodiments in which the production of a picture series along the $T_1$ relaxation curve requires only the measuring time of a conventional tomogram. For the determination of the $T_1$ relaxation times any desired repetition times are possible.

With the methods according to FIGS. 40 to 42 it is possible to take a series of highly resolves NMR tomograms whose intensity declines in accordance with the function $\exp(-(T-tau)/T_1)$. The third pulse is replaced for this purpose by a series of several "fraction pulses" $alpha_n$, the flip angle of which is equal to or less than 90 degrees in order to take a corresponding number of $T_1$ tomograms. In particular, the flip angles of the fraction pulses may be increased from pulse to pulse to compensate the decrease of the stored signal which is read portion-wise by the fraction pulses. Equal amounts of the signal are read using flip angles varying according to $alpha_{n-1}$ - arctan $(alpha_n)$, for example $alpha_1 = 26.6$ degree, $alpha_2 = 30$ degree, $alpha_3 = 35.3$ degree, $alpha_4 = 45$ degree, and $alpha_5 = 90$ degree for $n = 5$. The number of fraction pulses per sequence may be up to 10 or more. For the image series only one tomography experiment or measuring cycle with a selectable repetition time is necessary. Non-selective pulses may be replaced by frequency-selective pulses.

The method according to FIG. 40 furnishes a normal SE image and moreover a $T_1$ image series from a slice corresponding to the STE signals.

FIG. 41 shows an embodiment of this type of method which furnishes a $T_1$ image series of several slices. The fraction pulses in this case are slice pulses whose frequency content is different from fraction pulse to fraction pulse in order to select the various slices.

FIG. 42 relates to an embodiment with a four-pulse sequence for a two-point $T_1$ and a two-point $T_2$ determination from four images. When using alpha=45 degrees (3rd pulse) and beta=90 degrees (4th pulse) a 50% division of the magnetization results. Non-selective pulses may be replaced by slice pulses. In this case a multi-slice variant of the method is possible.

Hitherto no tomography method was known which with a single experiment permits taking a series of images along the $T_1$ relaxation curve. The present method types thus permits a considerable shortening of the measuring time, accordingly making quantitative $T_1$ measurements possible at all in clinical use.

FIGS. 43 to 49 relate to embodiments for producing resonance-line-selective tomograms. In particular, this permits detection of the frequency shifts caused by different chemical bonds.

The NMR tomograms are taken on the basis of individual lines of an NMR spectrum. Certain embodiments permit simultaneous taking of several selectable single-line tomograms.

Figure 43:
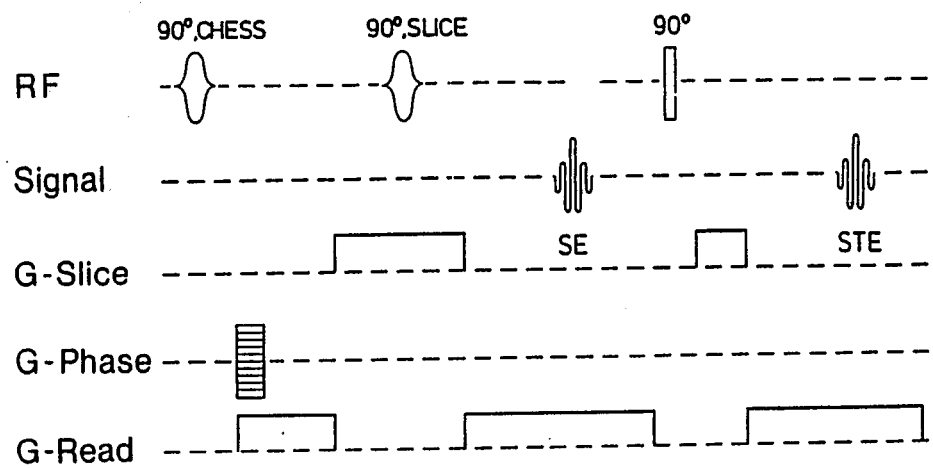
FIGS. 43 to 49 are embodiments for taking NMR tomograms on the basis of individual or several lines of an NMR spectrum.

The method according to FIG. 43 supplies a single-line tomogram and at the same time an SE image. The first RF pulse is a line-selective pulse and the second pulse a slice pulse. The third pulse can be a non-selective pulse.

Figure 44:
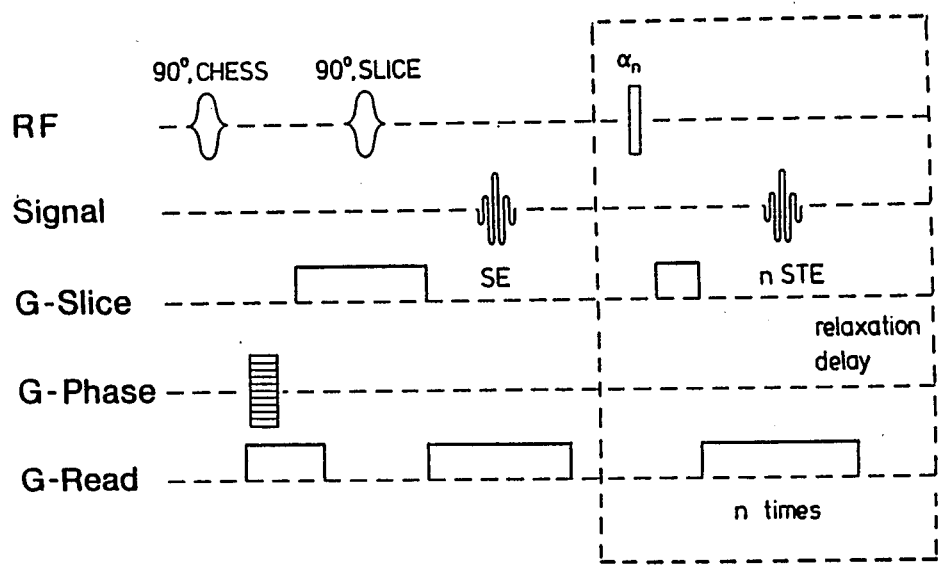

The method according to FIG. 44 permits the production of a single-line tomogram and a simultaneous $T_1$ measurement or the production of a $T_1$ image. Here, once again the third pulse is divided into a sequency of "fraction pulses" as explained above with reference to FIGS. 40 and 41.

Figure 45:
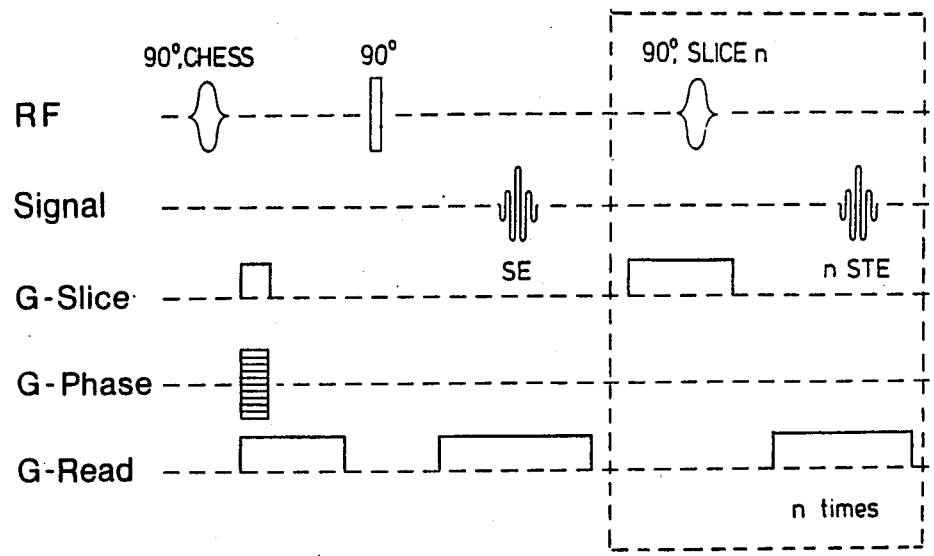

The method according to FIG. 45 provides a single-line tomogram for several slices on the basis of the STE signals and simultaneously a transillumination image on the basis of the SE signals.

Figure 46:
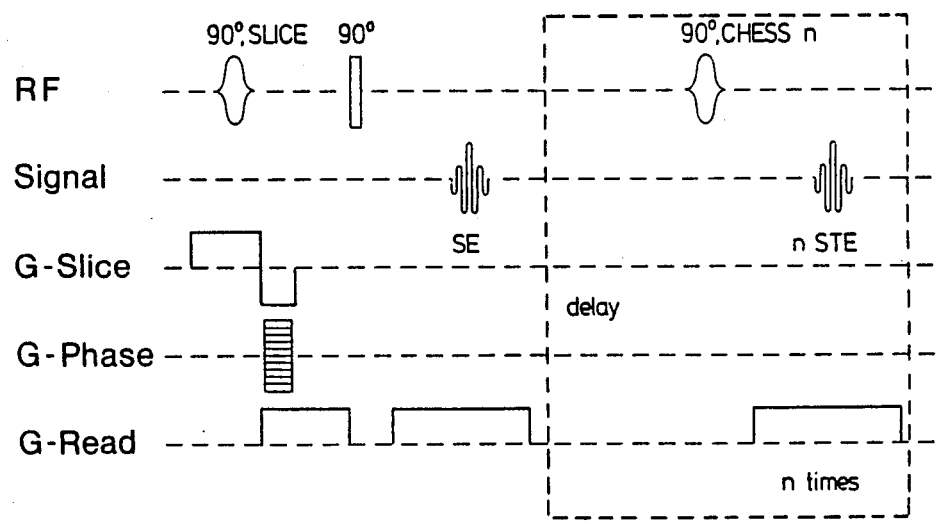

The method according to FIG. 46 provides several single-line tomograms which are generated by line-selective fraction pulses and are obtained from the corresponding different STE signals and at the same time a mixed image recovered from the SE signal. Consequently, for example $H_2O$ and fat can be represented in separate single-line tomograms and together in the mixed image.

Figure 47:
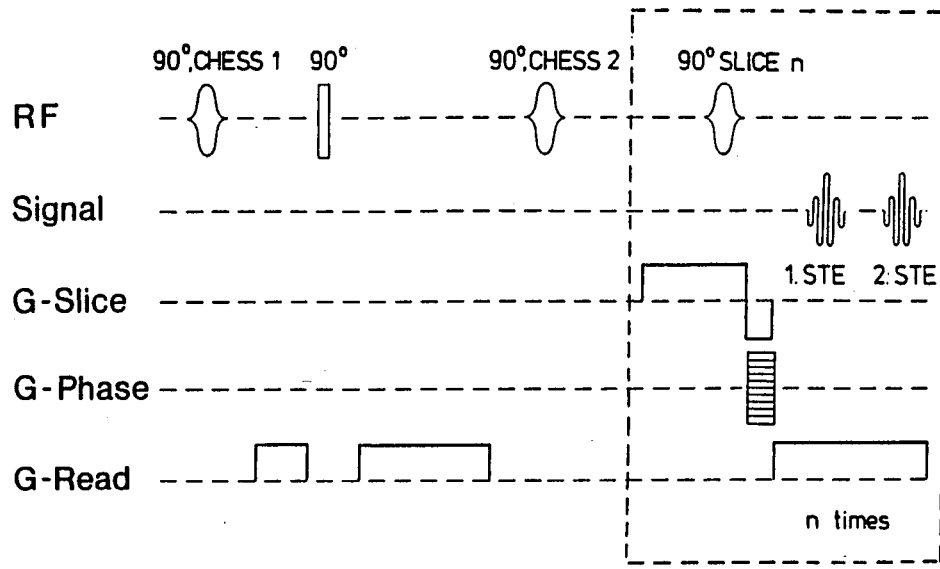
Figure 48:
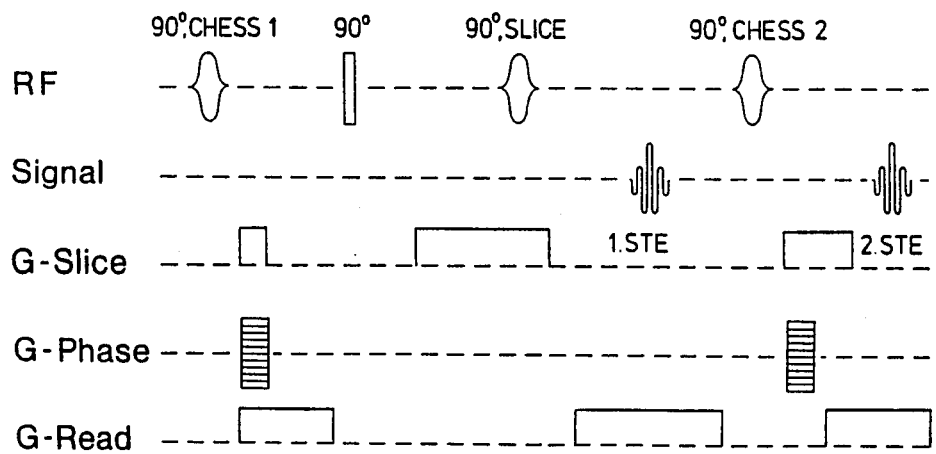
Figure 49:
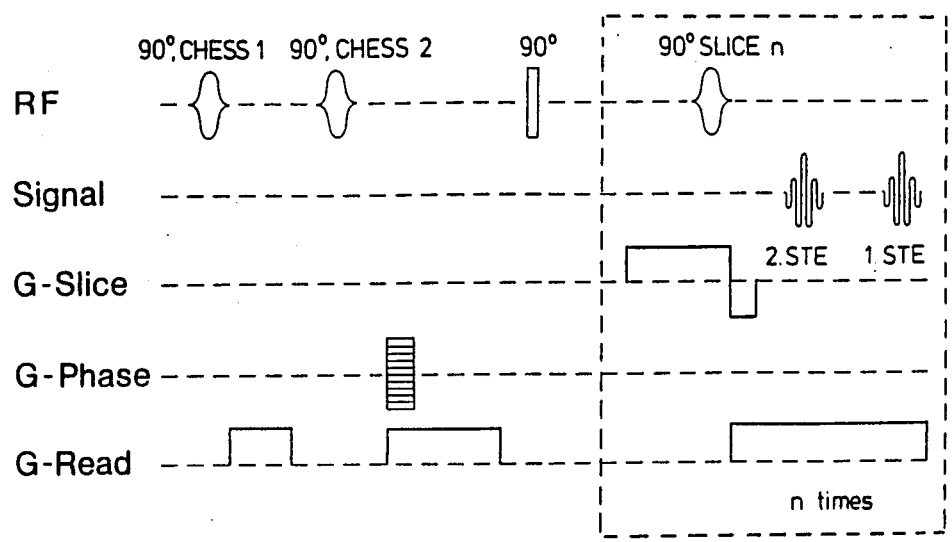

FIGS. 47 to 49 show alternative methods for taking the single-line tomograms, for example for fat and water.

Hitherto there was no method which furnished an NMR tomogram on the basis of a selectively excited resonance line in a single measuring cycle or experiment. Also, no method is known with which in a single measuring cycle or experiment at the same time several single-line tomograms and a conventional mixed image can be produced.

Figure 50:
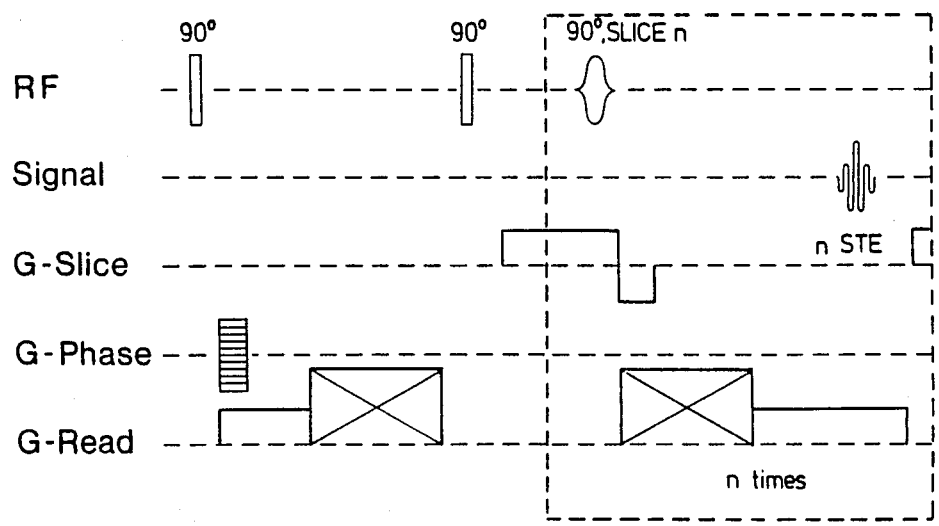
FIGS. 50 and 51 are embodiments of generating diffusion NMR tomograms.
Figure 51:
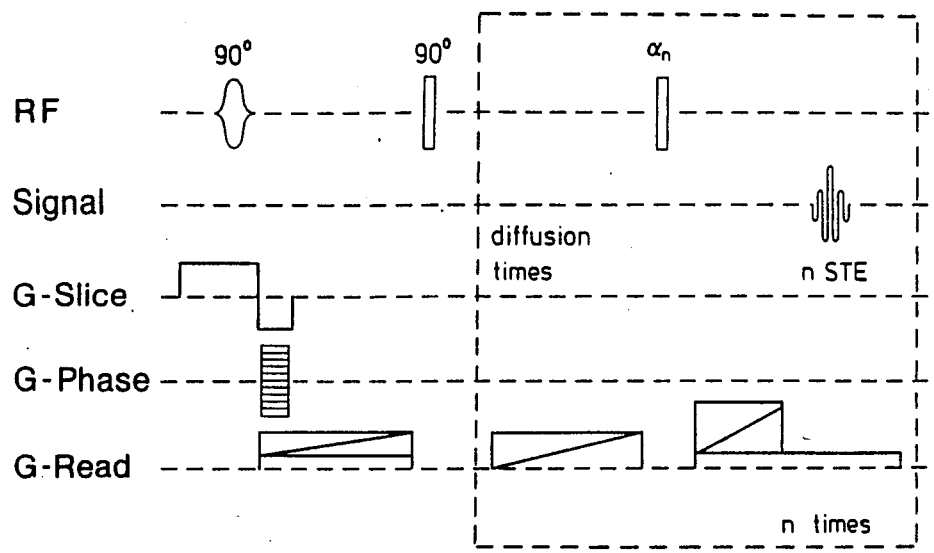

FIGS. 50 and 51 relate to embodiments for producing diffusion NMR tomograms. In such tomograms the local diffusion coefficient is the essential contrast-producing parameter which governs the image intensity. An evaluation of several images of different diffusion weightings permits evaluation of pure tomograms of the local diffusion coefficient. Non-selective pulses can be replaced by frequency-selective pulses, for example for the determination of changes of the diffusion coefficient of different molecules.

FIG. 50 shows a method of producing multi-slice diffusion images.

FIG. 51 shows a method for producing a series of diffusion images with different diffusion times in the measuring time of a conventional tomogram. For discrimination with respect to $T_1$ relaxation influences in addition a corresponding image series according to FIG. 40 should be measured. The sections of high amplitude of the read gradient (G read) denoted by a diagonal line are decisive for the generation of diffusion images.

FIGS. 52 to 56 relate to methods for generating flux NMR tomograms, i.e. tomograms for determining or representing flow effects. Non-selective pulses can be replaced by frequency-selective pulses.

Figure 52:
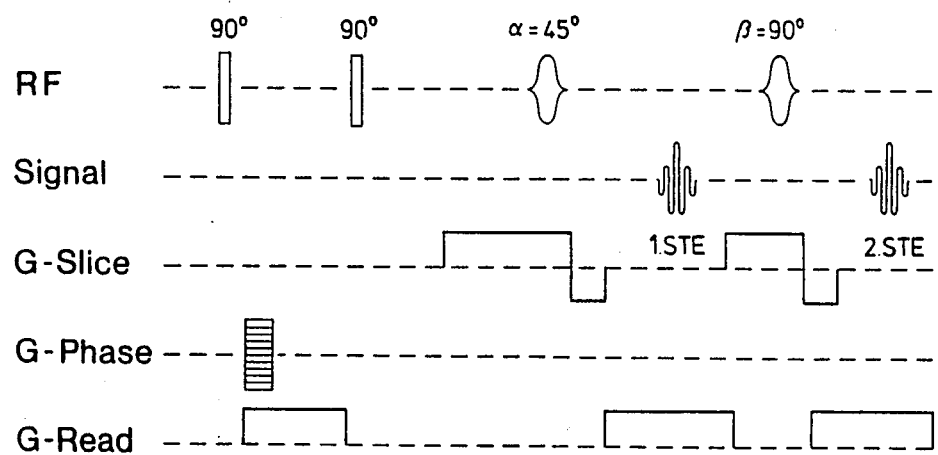
FIGS. 52 to 56 are diagrams for embodiments for generating flux NMR tomograms.

FIG. 52 shows a method for flux representation by an STE difference image (1st STE—2nd STE).

Figure 53:
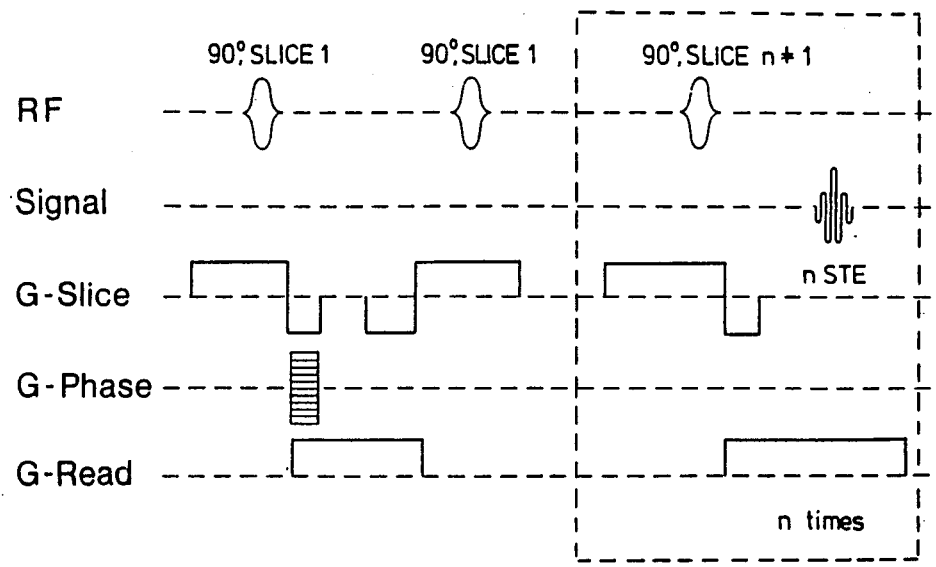

FIG. 53 shows a method of making multi-slice flux tomograms with which in particular the flow emerging from a slice can be made visible. The images of the target slices are obtained from the STE signals.

Figure 54:
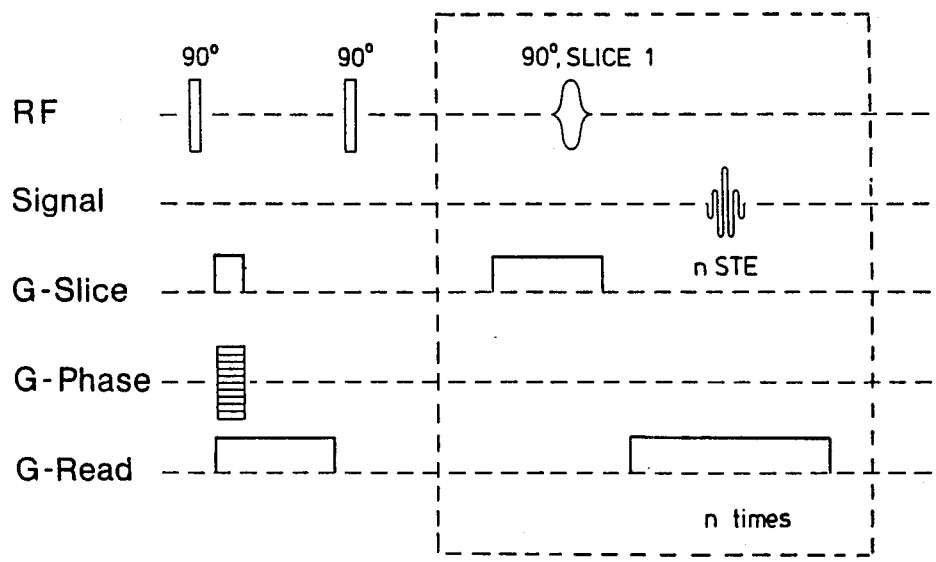

FIG. 54 shows a method for producing multiple tomograms of a slice with which in particular the flow entering a selected slice can be made visible. The respective slice is substantially "cleared" by the third pulse formed as slice pulse so that subsequent stimulated echoes from this slice can be generated substantially only by excited nuclei which have flowed into the slice.

Figure 55:
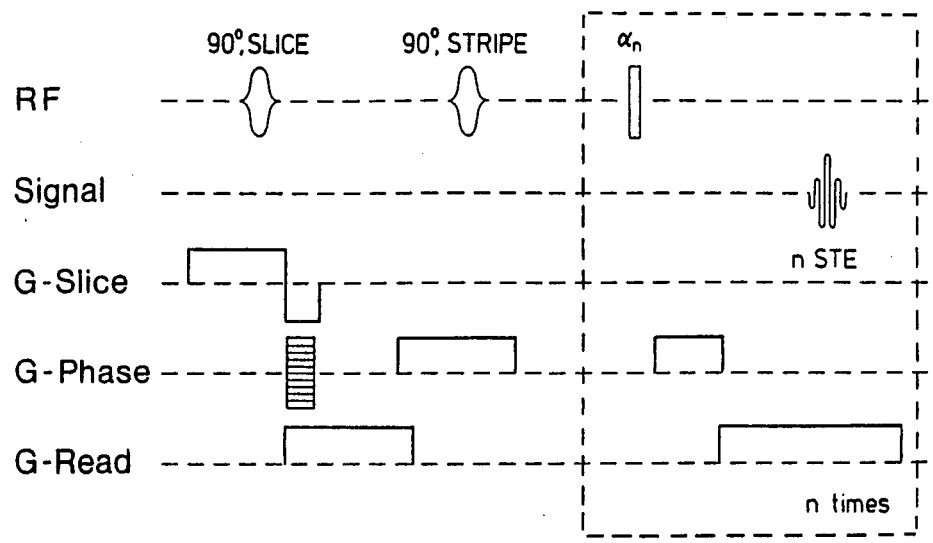

FIG. 55 shows a method for producing multiple tomograms of a slice for observation of the flow extending in the slice plane from a selected, in particular stripe-shaped area.

Figure 56:
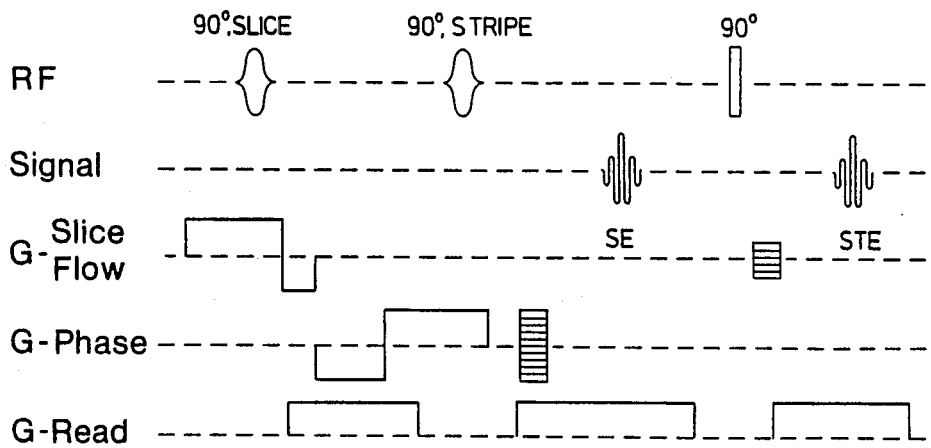

FIG. 56 shows a method which simultaneously furnishes an ordinary image (SE image) of a selected area and a corresponding 2D flux image (flux-space tomogram). The area can in particular be an edge strip of the specimen.

Figure 57:
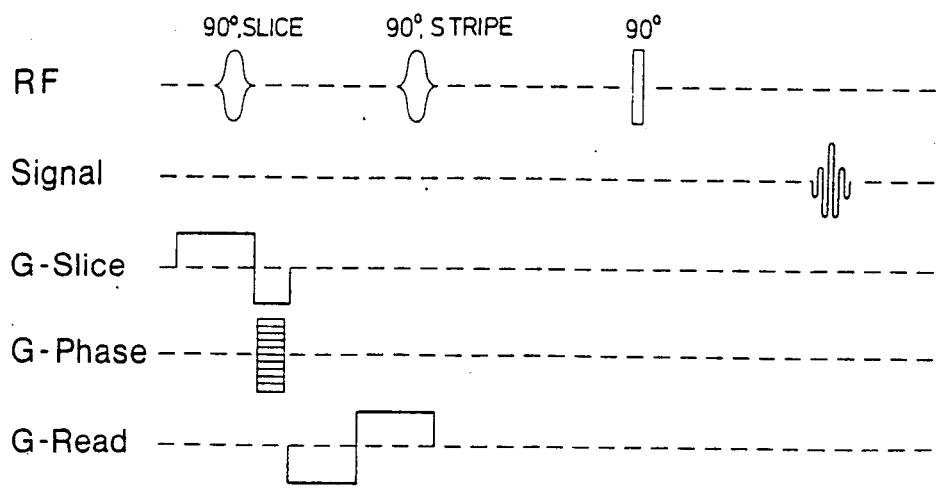
FIGS. 57 to 59 are embodiments for taking NMR tomograms representing information both about space and spectrum.
Figure 58:
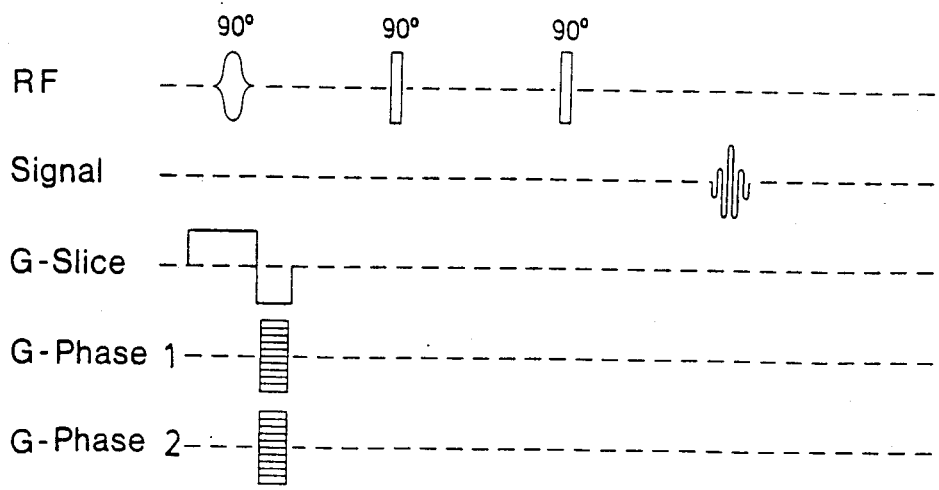
Figure 59:
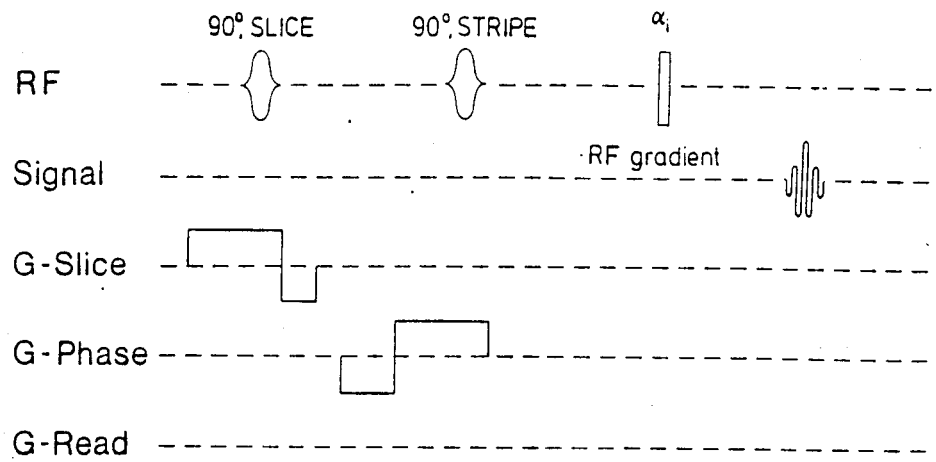

The methods according to FIGS. 57 to 59 make it possible to produce NMR tomograms which represent both spatial and spectral information.

FIG. 57 shows a method which furnished a 2D spectrum space tomogram of a selected stripe-shaped area.

The method according to FIG. 58 provides a 3D tomogram (spectrum space-space) of a slice. The STE signal can again be converted by a Fourier transformation to a frequency spectrum.

FIG. 59 shows a method for producing a 2D tomogram (spectrum - space) corresponding to FIG. 57, the space coding being replaced with the aid of a phase gradient in this case by an RF gradient (rotating frame imaging).

In contrast to the hitherto resolving spin-echo methods (90 degree-180 degree echo methods) the method operating with a three pulse sequence according to the invention makes it possible to wait for the dying down of eddy currents for an interval (e.g. 100 to 200 ms) in which only $T_1$ and not $T_2$ losses occur. The $T_1$ losses can be minimized by obtimizing the gradient arrays.

The methods according to FIGS. 60 to 67 relate to the production of so-called one-shot tomograms and permit taking of NMR tomograms with a measuring time which lies appreciably below one second. These methods are suitable in particular for real time imaging of variable processes.

Figure 60:
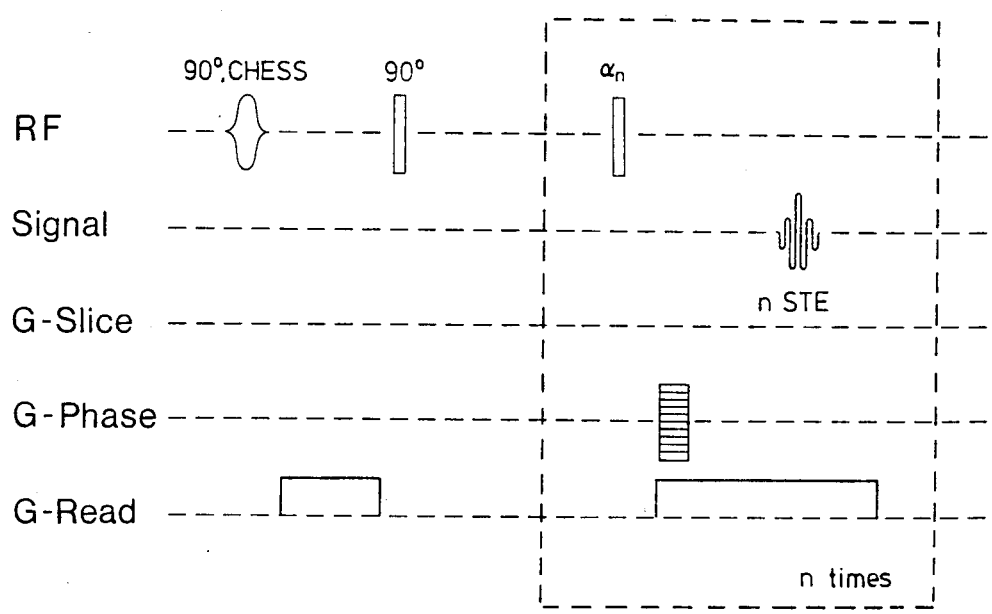
FIGS. 60 to 67 are particularly rapidly operating embodiments of the invention with which it is possible to take NMR tomograms with a single excitation and with measuring times between about 100 ms and 1 to $2T_1$ with variable spacial resolution.

FIG. 60 shows a method for rapid transillumination tomography. Since the first 90 degree pulse is a selective, in particular a line-selective, pulse, the distribution of for example water, fat or an element such as F, Na, P can be represented NMR tomographically. With read pulses (fraction pulses) of inadequate bandwidth it is expedient to eliminate the read gradients during the pulse duration. The schematic representation of the phase gradient means that after each fraction pulse another gradient strength is switched. The order of the passage through all the necessary gradient switchings can be varied.

Figure 61:
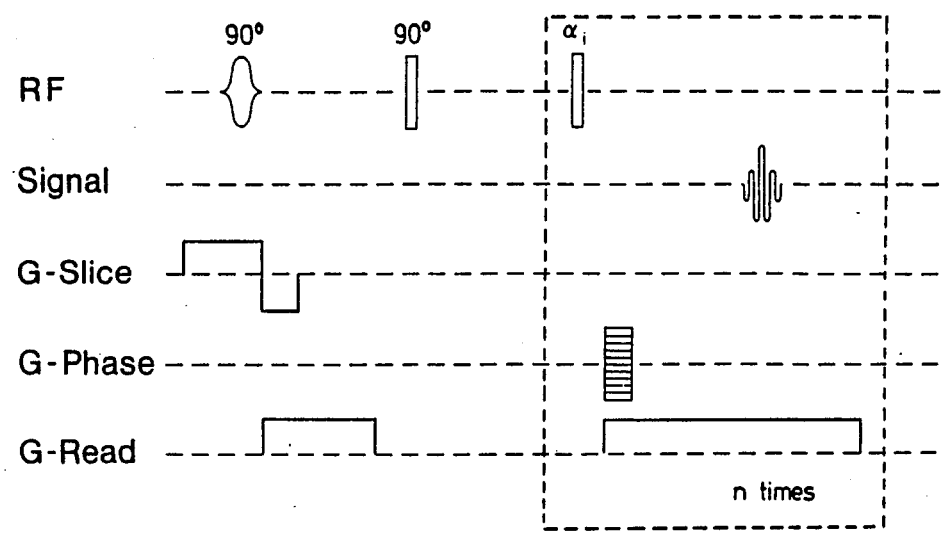

FIG. 61 shows a method for rapid slice image tomography in which the first pulse is used as slice pulse.

Figure 62:
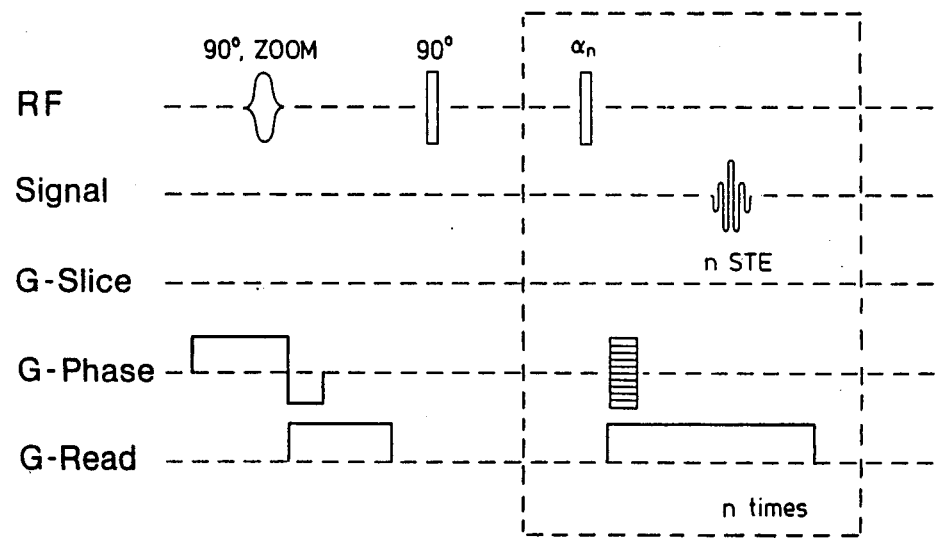
Figure 63:
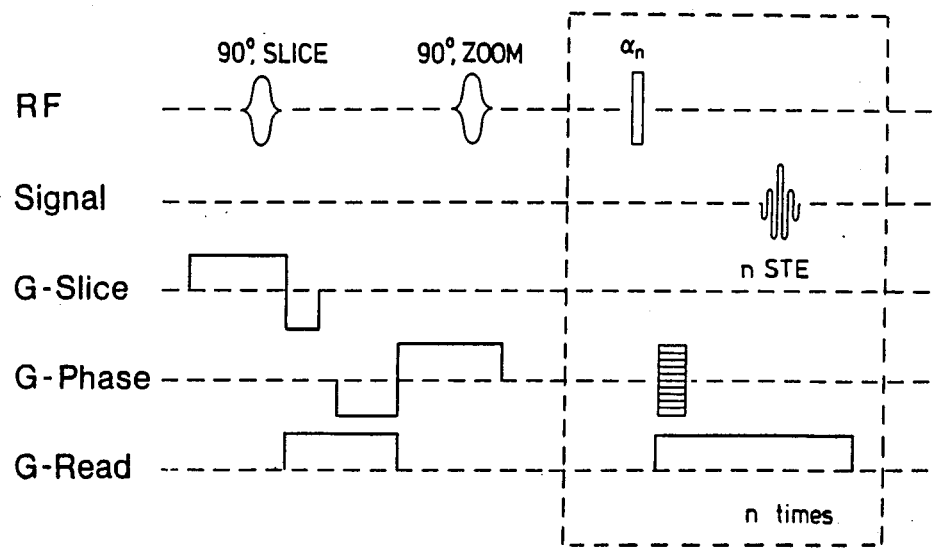
Figure 64:
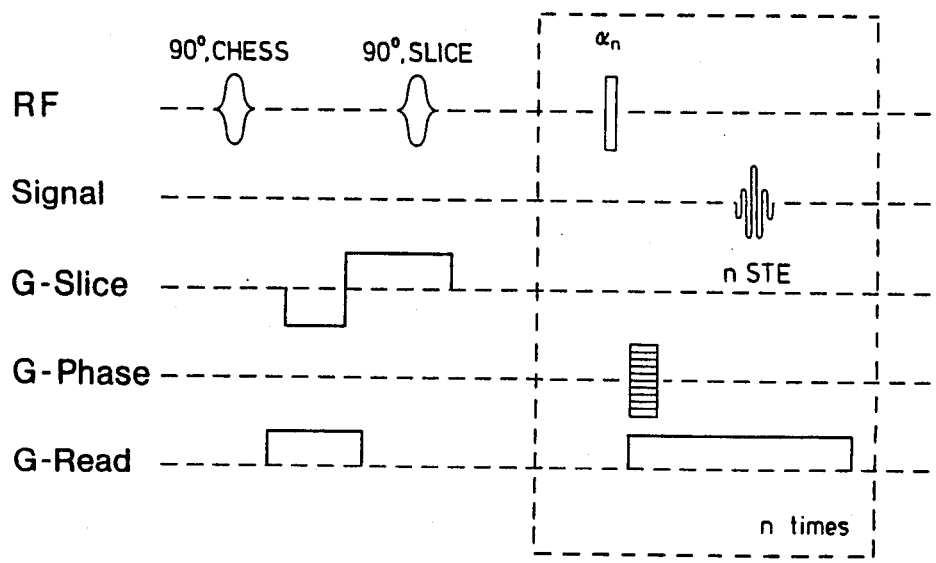

FIGS. 62 and 63 illustrate zoom variants of the methods according to FIGS. 60 and 61. FIG. 64 is a line-selective (chemical shift selective) variant of the method according to FIG. 61.

Figure 65:
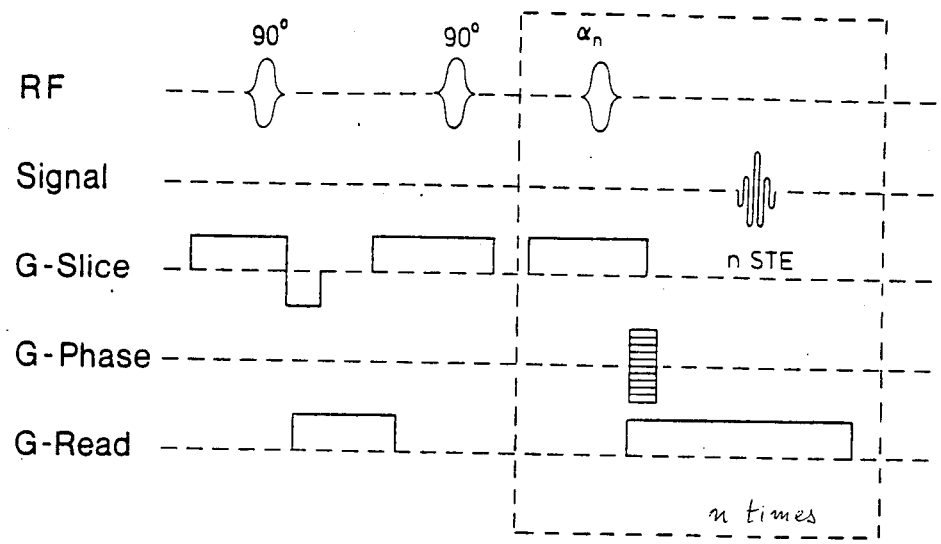

FIG. 65 is a variant of the method according to FIG. 61 only with slice-selective pulses.

Figure 66:
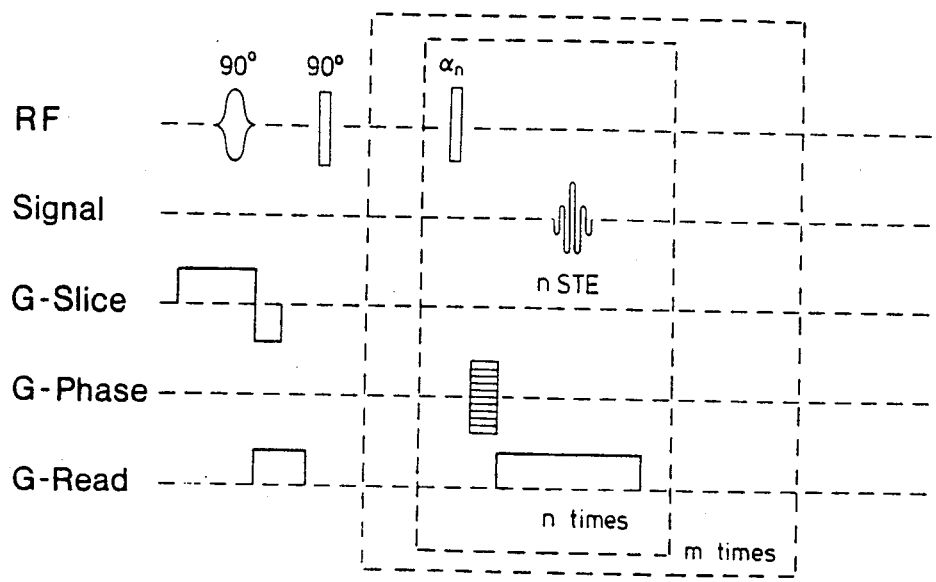

FIG. 66 shows a multiple variant of the method according to FIG. 61 with $T_1$ information. During the $T_1$ decay several images are taken and after completion of the series the procedure can be immediately restarted so that this method is also very well suited to a real time imaging of moving structures.

Figure 67:
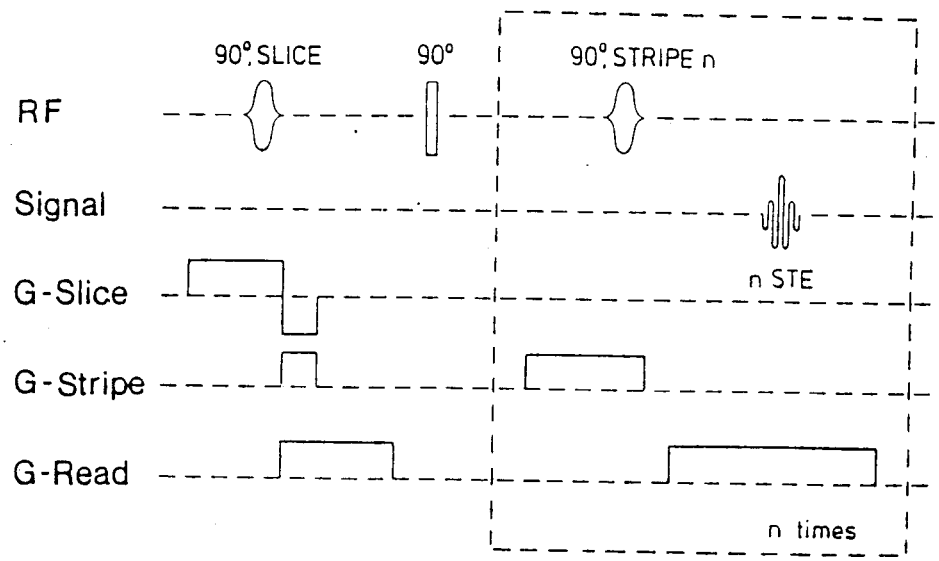

FIG. 67 shows a method for rapid slice image tomography on the basis of a one-shot multiple stripe imaging.

The methods according to FIGS. 60 to 67 avoid the very troublesome problems which arise in the prior art duet o rapid switching of the gradients and RF absorption. In addition, the signal intensity is folded only with the slow $T_1$ decay. The reconstruction can take place with conventional 1D or 2D FT algorithms.

Hereinafter some specific practical examples of embodiments of the methods referred to above will be explained in detail. As NMR apparatus a commerically available tomography/spectroscopy system of the company Bruker (karlsruhe, German Federal Republic) was used which includes a magnet having a bore of 40 cm diameter and a nominal field strength of 2.3 tesla (T), corresponding to 100 MHz proton resonance frequency.

EXAMPLE 1

Multi-Slice Imaging with Stimulated Echoes

Figure 68:
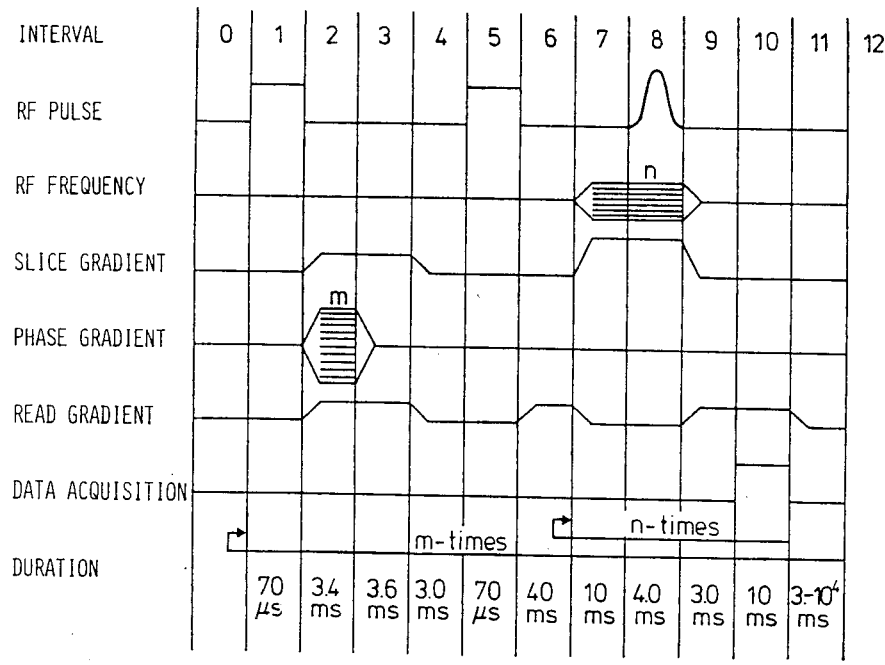
FIGS. 68 to 71 show the pulse sequences of four specific preferred examples of embodiment of the method according to the invention.

The pulse sequences explained in more detail hereinafter are illustrated in FIG. 68.

| Interval | Remarks |
|---|---|
| 0 | Before starting the sequence the RF frequency is set to the desired measuring frequency, for example to the exact resonant frequency of the water protons (about 100 MHz). |
| 1 | Switching of a non-selective RF pulse with rectangular envelope. When using a resonator specimen head (100 MHz $\phi$ 20 cm) and a transmitting power of 5-8 kW depending on the specimen being investigated pulse lengths arise of 50-100 microseconds for a flip angle of 90 degrees. On every other passage of the sequence (m different phase gradients!) the phase position of this pulse is turned through 180 degrees. |
| 2 | Switching on of the phase gradient. With repetition of the sequence with m differeat amplitudes (here m = 256) from $-0.7$ to $+0.7$ $10^{-4}$ T/cm this process is executed a total of 256 times. Switching on of the slice gradient for "refocusing" all subsequently switched slice gradients (interval 8). Amplitude 0.25 $10^{-4}$ T/cm. Switching on of the read gradient for preparing all read gradients for data acquisition in the intervals 9 and 10; amplitude 0.45 $10^{-4}$ T/cm. |
| 3 | Switching off of the phase gradient. |
| 4 | Switching off of the slice gradient; switching off of the read gradient. |
| 5 | As 1, but with constant phase position. |
| 6 | Switching on of the read gradient for dephasing undesirable signals, amplitude 0.45 $10^{-4}$ T/cm. |
| 7 | Switching off of the read gradient. switching on of the slice gradient. amplitude 0.5 $10^{-4}$ T/cm. Setting the RF frequency for the desired section plane. On repetition of this part of the sequence with the same read gradients a total of n different frequencies are set (in this case n = 7, frequency intervals alternating $+/-$ 1 kHz with respect to the resonant frequency set in interval 0). |
| 8 | "Selective" RF pulse with a flip angle of 90 degrees and gaussian envelope. The half-width of the frequency spectrum of the pulse is about 700 Hz. The phase position of the pulse is identical to that of the pulse in interval 1 and varies synchronously. |
| 9 | Resetting of the RF frequency to the original value before recording data; switching off of the slice gradients; switching on of the read gradient 0.45 $10^{-4}$ T/cm. |
| 10 | Acquisition of, in each case 256 "real" and "imaginary" data by quadrature detection with a spectral width of 25 kHz (scan time 20 microseconds). After completion of the data acquisition the sequence jumps back to the start of interval 7. This cycle for acquiring data from several section planes is carried out n times (in this case n = 7). |
| 11 | Switching off of the read gradient. |

After completion of the sequence, i.e. after interval 11, the sequence is repeated m times with incremented amplitudes of the phase gradient. For thispurpose it jumps back to the start of interval 1. An accumulation of measurements with the same phase gradient is possible but was not considered necessary experimetnally so that the total measuring time is m times the sum of the interval durations of intervals 1 to 11.

The measuring time for a multi-slice imaging with seven slices, slice thickness in each case 3 to 4 mm, is about 4 minutes.

EXAMPLE 2

Multiple CHESS Imaging

Figure 69:
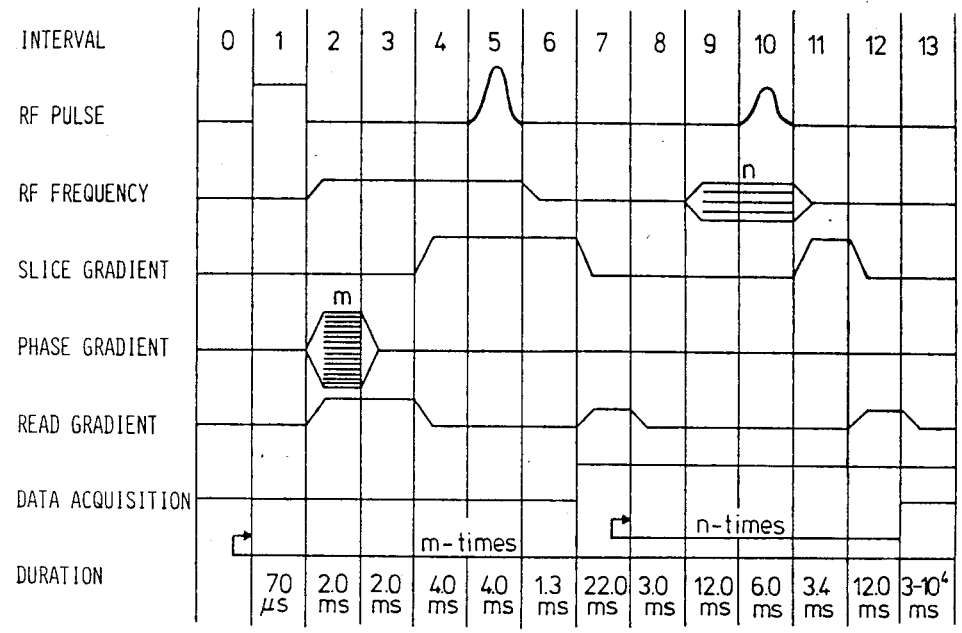

Producing a sumamtion image and several CHESS-STE images (CHESS=chemical shift selective) from one slice. The pulse sequences explained in detail below are illustrated in FIG. 69.

| Interval | Remarks |
|---|---|
| 0 | Before starting the sequence the RF frequency is set to the desired measuring frequency, for example to the exact resonant frequency of the water protons. |
| 1 | Switching a non-selective RF pulse with rectangular envelope when using a resonator specimen head (100 MHz, 20 cm diameter) and an RF transmitting power of about 5 kW, giving, depending on the specimen investigated, pulse lengths of 50 to 100 microseconds for a flip angle of 90 degrees. On every other passage through the total sequence with m differeat phase gradients the phase position of the pulse can be turned through 180 degrees. |
| 2 | Switching over the RF frequency for the desired section plane. Switching on of the phase gradient. On repetition of the sequence with m different amplitudes of the phase gradient (in this case m = 256 ) form −0.7 to +0.7 $10^{-4}$ T/cm this operation is carried out a total of 256 times. Switching on of the read gradient for pre-"refocusing" of all the read gradients subsequently switched in the intervals 7 and 12 for data acquisition. The gradient amplitude in this case is 0.64 $10^{-4}$ T/cm. |
| 3 | Switching off the phase gradient; the read gradient remains switched on; the RF frequency remains at the frequency of the image plane. |
| 4 | Switching off on the read gradient. Switching or of the slice gradient for pre-"refocusing" of the slice gradient. The amplitude of the slice gradient is 0.51 $10^{-4}$ T/cm. |
| 5 | Selective RF pulse with flip angle of 90 degrees and gaussian envelope. The half-width of the frequency spectrum of the pulse is about 700 Hz. In cooperation with the slice gradient the gives a slice thickness of about 3-4 mm. |
| 6 | The slice gradient remains further switched on for refocusing for data acquisition of the spin echo the interval 7. The RF frequency is switched to the desired reconstruction frequency. |
| 7 | Switching off of the slice gradient and switching on of the read gradient with the amplitude 0.46 $10^{-4}$ T/cm. The data acquistion is switched on for acquiring the spin echo and the stimulated echoes. For calculating the summation image and the CHESS images in each case 256 "real" and "imaginary" data points are selected from the total data set with "quadrature detection" with a spectral width of 25 kHz (scanning time 20 microseconds), centered about the respective echo maxima. |
| 8 | Switching off of the read gradient. |
| 9 | Switching over of the RF frequency to the resonant frequency of a substance to be selected. e.g. the fat protons. On the nth passage through the intervals 8–12 the frequency is set to n different NMR resonant frequencies (in this case n = 2 for the resonant frequencies of the water and fat protons). |
| 10 | Selective RF pulse with a flip angle of 90 degrees and gaussian envelope. The half-width of the frequency spectrum of the pulse is about 200 Hz. The RF pulse excites only one line of the NMR spectrum. The phase position of the pulse is switched synchronously with that of the pulse in interval 1. |
| 11 | Switching on of the slice gradient with an amplitude of 0.7 to $10^{-4}$ T/cm for refocusing the slice gradient from the intervals 4 and 5. Resetting of the RF frequency to the frequency of the image plane for data acquisition. |
| 12 | Switching off of the slice gradient; switching on of the read gradient, amplitude 0.46 $10^{-4}$ T/cm. Data acquisition of an NMR frequency-selective (CHESS) stimulated echo signal. 256 "real" and "imaginary" data points are acquired with "quadrature detection" with spectral width of 25 kHz (scanning time 20 microseconds). Thereafter, the intervals 8–12 are passed through n times for acquiring n (in this case n = 2) frequency-selected simulated echo images. |
| 13 | Switching off of the read gradient and the data acquisition. |

After completion of the total sequence, i.e. after interval 13, the sequence is repeated m times with incremented amplitudes of the phase gradient. The sequence jumps back each time to interval 1. An accumulation of measurements with the same phase gradient is possible for improving the signal/noise ratio but was not found necessary experimentally.

The total measuring time of the summation image and m different CHESS images is m times the sum of the interval durations of interval 1 to 13 inclusive.

The measuring time for composite image, a water image, and a fat image, slice in each case 3 to 4 mm, for a test object is about 4 minutes.

EXAMPLE 3

Multiple Imaging of the $T_1$ Relaxation Curve with Stimulated Echoes

Figure 70:
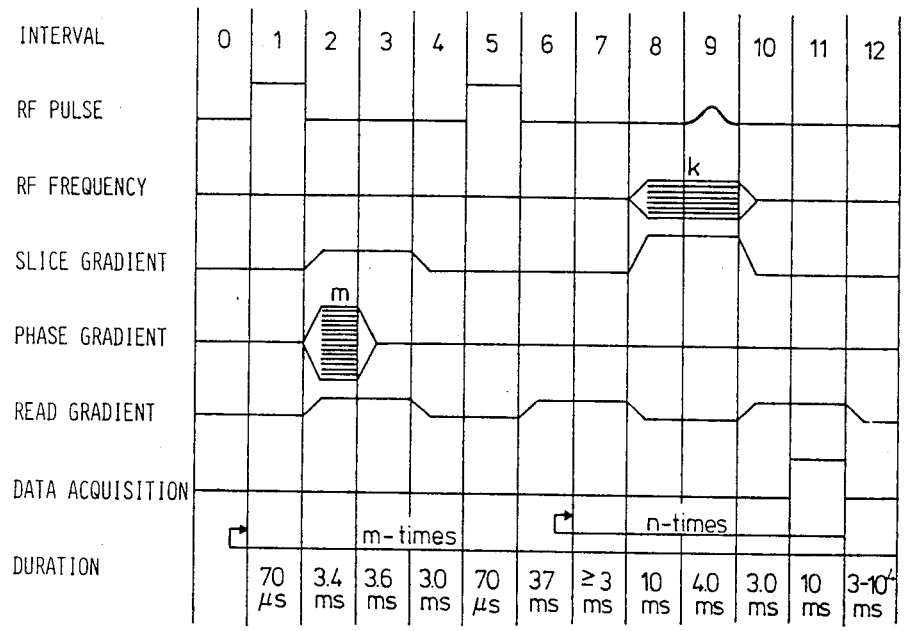

The pulse sequences explained in detail below are illustrated in FIG. 70.

| Interval | Remarks |
|---|---|
| 0 | Before starting the sequence the RF frequency is set to the desired measuring frequency, for example to the exact reasonant frequency of the water protons. |
| 1 | Switching of a non-selective RF pulse with rectangular envelope. When using a resonator specimen head (100 MHz $\phi$ 20 cm) and a transmitting power of 5–8 kW depending on the speciment being investigated pulse lengths arise of 50–100 microseconds for a flip angle of 90 degrees. On every other passsge of the sequence (m different phase gradients!) the phase positon of this pulse is turned through 180 degrees. |
| 2 | Switching on of the phase gradient. With repetition of the sequence with m differeat amplitdues (here m = 256) from −0.7 to +0.7 $10^{-4}$ T/cm this process is executed a total of 256 times. Switching on of the slice gradient for "refocusing" all subsequently switched slice gradients (interval 9). Amplitude 0.25 $10^{-4}$ T/cm. Switching on of the read gradient for preparing all read gradients for data acquisition in the intervals 10 and 11; amplitude 0.45 $10^{-4}$ T/cm. |
| 3 | Switching off of the phase gradient. |
| 4 | Switching off of the slice gradient; switching off of the read gradient. |
| 5 | As 1, but with constant phase position. |
| 6 | Switching on of the read gradient for dephasing undesirable signals, amplitude 0.45 $10^{-4}$ T/cm. |
| 7 | Variable time for setting the relaxation intervals (duration of the intervals 7–11, the intervals 8–11 amounting together to 27 ms). For a multi-slice measurement (5 slices, k = 5, 5 relaxation intervals, n = 25) comprising a total of 25 single images a duration of 3 ms was chosen. For a single-slice measurement of the human hand (k = 1, n = 16) comprising 16 single images a duration of 23 ms was chosen. |

| Interval | Remarks |
|---|---|
| 8 | Switching off of the read gradient; switching on of the slice gradient with a amplitude of 0.45 $10^{-4}$ T/cm. Setting the RF frequency for the desired section plane. On repetition of this part of the sequence (a total of n times) k different frequencies are set (in this case k = 1). |
| 9 | "Selective" RF pulse with gaussian envelope. The half-width of the frequency spectrum of the pulse is about 700 Hz. The phase position of the pulse is identical to that of the pulse in interval 1 and varies synchronousy. The flip angles of the RF pulse repeated n times were made the same. For a 16 image measurement they were smaller or equal to 9 degrees and for a 5 slice measurement each of 5 images smaller or equal to 15 degrees. |
| 10 | Resetting of the RF frequency to the original value for acquisition of the data; switching off of the slice gradient; switching on of the read gradient. Amplitude 0.45 $10^{-4}$ T/cm. |
| 11 | Acquisition of in each case 256 "real" and "imaginary" data with quadrature detection with a spectral width of 25 kHz (scanning time 20 microseconds). After completion of the data acquisition the sequence jumps back to the start of interval 7. This cycle for acquisition of data from several section planes and/or several images with different relaxation intervals is carried out n times (in this case n = 16). |
| 12 | Switching off of read gradient. |

After completion of the sequence, i.e. after interval 12, the sequence is repeated m times with incremented amplitudes of the phase gradient. For this purpose it jumps back to the start of interval 1. An accumulation of measurements with the same phase gradients is possible but was not considered necessary experimentally so that the total measuring time is m times the sum of the interval durations of intervals 1 to 12.

EXAMPLE 4

High-Speed Tomography with Stimulated Echoes (64×128 images)

Figure 71:
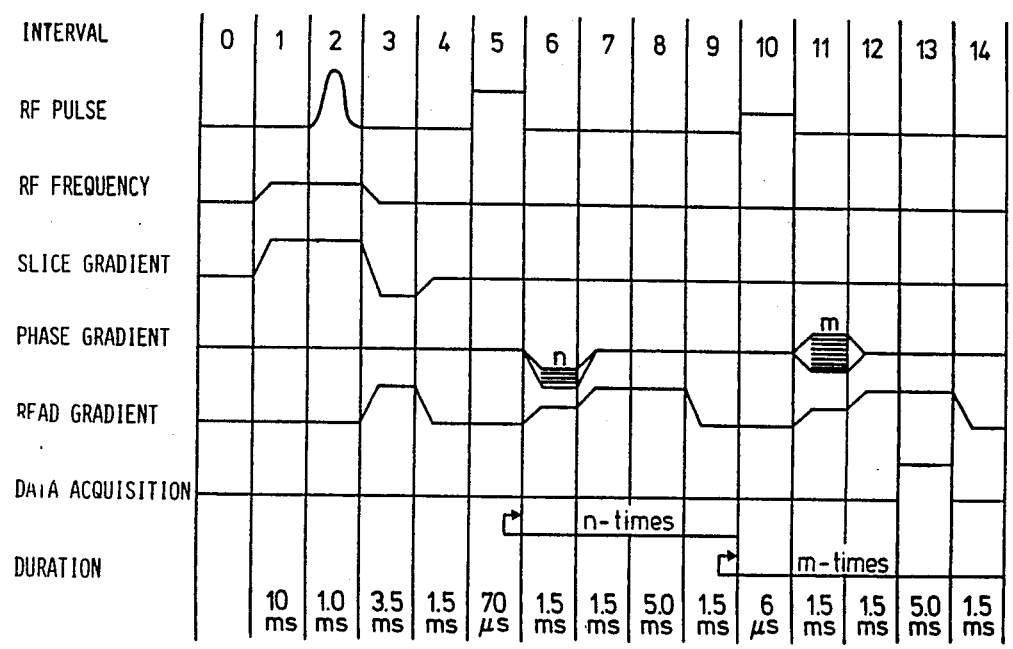

The pulse sequences explained in detail below are illustrated in FIG. 71.

| Interval | Remarks |
|---|---|
| 0 | Before starting the sequence the RF frequency is set to the desired measuring frequency, for example to the exact resonant frequency of the water protons. |
| 1 | Switching on of the slice gradient with the amplitude 0.5 $10^{-4}$ T/cm; setting of the RF frequency for the desired section plane. |
| 2 | "Selective" RF pulse with a flip angle of 90 degrees and gaussian envelope. The half-width of the frequency spectrum of the pulse is about 2 kHz. |
| 3 | Resetting of the RF frequency to the original value before acquisition of the data; switching over of the slice gradient to the amplitude $-0.31$ to $10^{-4}$ T/cm; switching on of the read gradient, amplitude 0.45 $10^{-4}$ T/cm. |
| 4 | Switching off of the slice gradient; switching off of the read gradient. |
| 5 | Switching of a non-selective RF pulse with rectangular envelope. When using a resonator specimen head (100 MHz $\phi$ 20 cm) and a transmitting power of 5-8 kW depending on the specimen being investigated pulse lengths arise of 50-100 microseconds for a flip angle of 90 degrees. |
| 6 | Switching on of the phase gradient. On repetition of the intervals 6-9 with m different amplitudes (in this case m = 4) from $-0.43$, to $-0.37$ $10^{-4}$ T/cm this operation is carried out a total of 4 times; Switching on of the read gradient amplitude 0.35 $10^{-4}$ T/cm. The repeated passing through of the intervals 6 to 9 is for dephasing the undesirable spin echoes and for setting an equilibrium condition for the necessary high-speed switching of the two gradients. |
| 7 | Switching off of the phase gradient; further switching of the read gradient. Amplitude 0.45 $10^{-4}$ T/cm. |
| 8 | Waiting period of duration corresponding to the data acquisition to take place in interval 13. |
| 9 | Switching off of the read gradient. After completion of interval 9 the sequence jumps back to the start of interval 6 (in this case n = 4). |
| 10 | As 5 but with shorter pulse lengths, the pulses corresponding to flip angles <<90 degrees. On the mth passage through the intervals 10-14 the pulse lengths (interval 10) are made equal (in this case m = 64). This process lead to acquiring 64 stimulated echoes with different phase codings from which an 64 × 128 image can be calculated. |
| 11 | As 6 but with m incremented amplitudes from 0.37 $10^{-4}$ T/cm to +0.37 $10^{-4}$ T/cm (in this case m = 64). |
| 12 | As 7. |
| 13 | Acquisition of in each case 128 "real" and "imaginary" data by quadrature detection with a spectral width of 25 kHz (scanning time 20 microseconds). |
| 14 | Switching off of the read gradient. |

After completion of interval 14 the sequence jumps back to the start of interval 10. This cycle for acquiring the m differently phase-coded echoes is executed m times (in this case m=64). The measurement of the data thus lasts m times the sum of the intervals 10-14, the duration of the total sequence additionally containing the sum of the interval 5 and n times the sum of the intervals 6-9.

What is claimed is:

1. A method for locally resolved investigation of a specimen, in which the specimen is exposed to a constant magnetic field and a variable combinatio of three gradient magnetic fields directed substantially perpendicularly to each other and the specimen is subjected to a sequence of high-frequency pulses which sequence contains three successive pulses with flip angles differeing from 180 degrees and multiples thereof, and in which signals corresponding to a magnetic resonance of spin moments, in particular of nuclear spin moments, are measured, characterized in that the interval (tau) between the first and the second of said three pulses is greater than $T_{2eff}$ and smaller than $5T_2$, and that the interval (T-tau) between the second and the third pulses is greater than $T_{2eff}$ and smaller than $5T_1$, wherein $T_1$ is the spin-lattice relaxation time,
$T_2$ is the spin-spin relaxation time, and
$T_{2eff}$ is the effective spin-spin relaxation time of the spinds to be determined in the specimen, that at least one of the gradient fields is switched over during at least one of the following periods of time:
(a) between the first and the second pulses,
(b) between the second and the third pulses,
(c) after the third pulse, that at least one of the pulses is a frequency-selective pulse and that at least one echo signal stimulated by the third pulse is detected and evaluated.

2. Method according to claim 1, characterized in that tau is smaller than $2T_2$.

3. Method according to claim 1, characterized in that (T-tau) is smaller than $3T_2$.

4. Method according to claim 1, characterized in that the frequency-selective pulse is replaced by a sequence of separate single pulses which gives the necessary frequency selectivity.

5. Method according to claim 4, characterized in that at least two of the single pulses contain different carrier frequencies.

6. Method according to claim 4, characterized in that the single pulses contain the same carrier frequencies.

7. Method according to claim 6, characterized in that the single pulses are non-selective ("hard") pulses, i.e. a substantially rectangular envelope curve, have as short as possible a duration and as high as possible an amplitude and in themselves are not selective.

8. Method according to claim 1, characterized in that the at least one frequency-selective pulse is a frequency-modulated pulse.

9. Method according to claim 1, characterized in that the first pulse is a |90 degree| pulse (±10%).

10. Method according to claim 1, characterized in that the second pulse is a |90 degree| pulse (±50%).

11. Method according to claim 1, characterized in that the third pulse is a |90 degree| pulse (±50%).

12. Method according to claim 1, characterized in that at least the first and the second pulse are substantially 90 degree pulses.

13. Method according to claim 1, characterized in that the third pulse is a pulse corresponding to a fraction of said flip angle, that the third pulse is followed by at least one further "fraction pulse" at a distance which is greater than the distance between the first and second pulses, and that each stimulated echo following one of the further pulses is detected and evaluated.

14. Method according to claim 13, characterized in that the flip angle of each fraction pulse is less than 15 degrees.

15. Method according to claim 13, characterized in that the spacing of each fraction pulse from the preceding pulse is greater than 2 tau.

16. Method according to claim 13, characterized in that the flip angle of each further pulse is greater than the flip angle of each preceding pulse.

17. Method according to claim 1, characterized in that the first pulse is a slice pulse.

18. Method according to claim 1, characterized in that the second pulse is a slice pulse.

19. Method according to claim 1, characterized in that the second pulse is a slice pulse.

20. Method according to claim 17, characterized in that the remaining pulses of the three pulses are non-selective pulses.

21. Method according to claim 18, characterized in that the remaining pulses of the three pulses are non-selective pulses.

22. Method according to claim 19, characterized in that the remaining pulses of the three pulses are non-selective pulses.

23. Method according to claim 1, characterized in that one of the pulses is a slice pulse and another of the pulses is a fragment (zoom pulse).

24. Method according to claim 1, characterized in that at least one of the pulses is a resonance-line-selective pulse.

25. Method according to claim 1, characterized in that the first pulse is a resonance-line-selective pulse.

26. Method according to claim 1, characterized in that the first pulse is a slice pulse.

27. Method according to claim 1, characterized in that the first pulse is a fragment or zoom pulse.

28. Method according to claim 23, characterized in that the second pulse is a non-selective (hard) pulse.

29. Method according to claim 24, characterized in that the second pulse is a non-selective (hard) pulse.

30. Method according to claim 25, characterized in that the second pulse is a non-selective (hard) pulse.

31. Method according to claim 23, characterized in that the second pulse is a slice pulse.

32. Method according to claim 24, characterized in that the second pulse is a slice pulse.

33. Method according to claim 25, characterized in that the second pulse is a slice pulse.

34. Method according to claim 1, characterized in that the generation, observation and evaluation of stimulated echo signals is combined with other methods, in particular spinecho tomography methods, by adding 180 degrees pulses.

35. An apparatus for locally resolved investigation of a specimen, said apparatus comprising means for exposing a specimen to a constant magnetic field and a variable combination of three gradient magnetic fields directed substantially perpendicularly to each other and to a sequence of high-frequency (RF) pulses which contains three successive pulses with flip angles differing from 180 degrees and multiples thereof, and means (24,30,14) for detecting signals corresponding to a magnetic resonance of spin moments, in particular of nuclear spin moments in said specimen, characterized in that said exposing means (14,16,18,20,22,24,30) produces said sequence so that the interval (tau) between the first and the second of said three pulses is greater than $T_{2eff}$ and smaller than $5T_2$, and that the interval (T-tau) between the second and the third pulses is greater than $T_{2eff}$ and smaller than $5T_1$, wherein $T_1$ is the spin-lattice relaxation time, $T_2$ is the spin-spin relaxation time, and $T_{2eff}$ is the effective spin-spin relaxation time of the spins to be determined in the specimen, said exposing means further effecting switching of at least one of said gradient fields during at least one of the following periods of time:

(a) between the first and the second pulses, (b) between the second and the third pulses, (c) after the third pulse, wherein at least one of the RF pulses is a frequency-selective pulse and wherein said detecting means detects at least one echo signal, stimulated by the third pulse, for evaluation.

36. The method of claim 1, wherein at least one gradient field is switched over between said first and second pulses and between said second and third pulses.

37. The method of claim 1, wherein at least one graident field is switched over between said first and second pulses and after said third pulse.

38. The method of claim 1, wherein at least one gradient field is switched over between said second and third pulses and after said third pulse.

39. The method of claim 1, wherein at least one gradient field is switched over between said first and second pulses, and between said second and third pulses, and after said third pulse.

* * * * *

UNITED STATES PATENT AND TRADEMARK OFFICE
CERTIFICATE OF CORRECTION

PATENT NO. : 4,748,409
DATED : May 31, 1988
INVENTOR(S) : Jens FRAHM, Axel HAASE, Wolfgang HAENICKE It is certified that error appears in the above-identified patent and that said Letters Patent is hereby corrected as shown below:

Col. 2, line 17, "presented" should be -- represented --
Col. 2, line 20, "if" should be -- is --
Col. 2, line 35, "dies" should be -- died --
Col. 9, line 56, "duet 0" should be -- due to --
Col. 9, line 64, "karlsruhe" should be -- Karlsruhe --
Col. 10, line 60, "thispurpose" should be -- this purpose --
Col. 11, line 4, "sumamtion" should be -- summation --
Col. 11, line 35, "off on" should be -- off of --
Col. 11, line 36, "or of" should be -- on of --
Col. 11, line 40, "the gives" should be -- this gives --
Col. 12, line 27, "thickness" was omitted after "slice"
Col. 15, claim 13, line 5 "betweenthe" should be -- between the --

Signed and Sealed this

Seventh Day of February, 1989

Attest:

DONALD J. QUIGG

Attesting Officer

Commissioner of Patents and Trademarks